US012713777B2

(12) United States Patent
Lee et al.

(10) Patent No.: US 12,713,777 B2
(45) Date of Patent: Aug. 18, 2026

(54) LIGHT EMITTING DISPLAY DEVICE INCLUDING MULTI-PORTION SPACER

(71) Applicant: Samsung Display Co., LTD., Yongin-si (KR)

(72) Inventors: Jun Hee Lee, Yongin-si (KR); Yeong Ho Lee, Yongin-si (KR); Choong Youl Im, Yongin-si (KR); Hyun Duck Cho, Yongin-si (KR); Beohm Rock Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 553 days.

(21) Appl. No.: 18/314,622

(22) Filed: May 9, 2023

(65) Prior Publication Data

US 2024/0049516 A1 Feb. 8, 2024

(30) Foreign Application Priority Data

Jul. 27, 2022 (KR) ........................ 10-2022-0093439

(51) Int. Cl.
*H10K 59/12* (2023.01)
*H10K 59/122* (2023.01)
(Continued)

(52) U.S. Cl.
CPC ........... *H10K 59/122* (2023.02); *H10K 59/40* (2023.02); *H10K 59/65* (2023.02); *H10K 59/873* (2023.02);
(Continued)

(58) Field of Classification Search
CPC ...... H10K 50/865; H10K 50/13; H10K 50/15; H10K 50/17; H10K 50/81; H10K 50/82;
(Continued)

(56) References Cited

U.S. PATENT DOCUMENTS 10,879,316 B2 * 12/2020 Lee ........................ H10K 59/40
11,296,159 B2 4/2022 Choi et al.
(Continued)

FOREIGN PATENT DOCUMENTS

CN 111180497 A 5/2020
CN 114792707 A1 7/2022
(Continued)

OTHER PUBLICATIONS

Fung et al., Tandem Organic Light-Emitting Diodes; Advanced Materials; Adv. Mater© 2016; pp. 1-28.

*Primary Examiner* — Ida M Soward
(74) *Attorney, Agent, or Firm* — Womble Bond Dickinson (US) LLP

(57) ABSTRACT

A light emitting display device includes: a substrate; an anode on the substrate; a pixel defining layer having an opening overlapping the anode; an emission layer in the opening of the pixel defining layer; a spacer on the pixel defining layer and having a step; a cathode formed in the emission layer, the pixel defining layer, and the spacer; an encapsulation layer on the cathode; and a light blocking layer on the encapsulation layer, wherein the spacer includes a first portion and a second portion that is lower than the first portion and is integrally formed with the first portion, and the first portion and the second portion of the spacer overlaps the light blocking layer in a plan view.

20 Claims, 26 Drawing Sheets

(51) Int. Cl.
*H10K 59/40* (2023.01)
*H10K 59/65* (2023.01)
*H10K 59/80* (2023.01)
*H10K 102/00* (2023.01)

(52) U.S. Cl.
CPC ... *H10K 59/8792* (2023.02); *H10K 2102/311* (2023.02)

(58) Field of Classification Search
CPC .... H10K 50/844; H10K 59/122; H10K 59/40; H10K 59/65; H10K 59/873; H10K 59/8792; H10K 59/35; H10K 59/38; H10K 59/8723; H10K 59/12; H10K 59/8791
See application file for complete search history.

(56) References Cited

U.S. PATENT DOCUMENTS 11,869,268 B2 1/2024 Hu et al.
2010/0207107 A1 8/2010 Kim
2015/0214284 A1* 7/2015 Kim ...................... H10K 50/86 257/40
2020/0091257 A1* 3/2020 Sun ...................... H10K 77/111
2021/0066419 A1* 3/2021 Byun ................... H10K 59/122
2021/0083190 A1 3/2021 Qu et al.
2021/0359247 A1* 11/2021 Wang .................. H10K 71/621
2022/0131111 A1 4/2022 Lee et al.
2022/0384531 A1 12/2022 Xu et al.
2022/0415979 A1 12/2022 Choi et al.
2022/0415993 A1* 12/2022 Ryu ..................... H10K 59/131
2022/0416216 A1* 12/2022 Woo ..................... H10K 59/123
2023/0255062 A1* 8/2023 Kwon .................... H10K 71/00 257/91
2023/0345783 A1 10/2023 Li et al.
2023/0354680 A1 11/2023 Li et al.
2024/0054807 A1 2/2024 Hu et al.

FOREIGN PATENT DOCUMENTS

EP 4109545 A1 12/2022
EP 4113617 A1 1/2023
JP 2010-287421 A 12/2010
JP 2017-227858 A 12/2017
KR 10-2012-0127236 A 11/2012
KR 10-2018-0002364 A 1/2018
KR 10-2019-0134991 A 12/2019
KR 10-2021-0043062 A 4/2021
KR 10-2022-0056929 A 5/2022

* cited by examiner

FIG. 10

| | Comparative example 1 | Comparative example 2 | Embodiment | Comparative example 3 |
|---|---|---|---|---|
| Cross -sectional structure | 220 230 385 380 Anode | 220 230 385 380 Anode | 220 230 385 380 Anode | 220 230 380 Anode |
| Diffraction pattern | | | | |
| Planar structure | 385 OPBM OP | OPBM OP | OPBM OP | OPBM OP |

LIGHT EMITTING DISPLAY DEVICE INCLUDING MULTI-PORTION SPACER

CROSS-REFERENCE TO RELATED APPLICATION

This application claims priority to and the benefit of Korean Patent Application No. 10-2022-0093439 filed in the Korean Intellectual Property Office on Jul. 27, 2022, the entire content of which is incorporated herein by reference in its entirety.

BACKGROUND

1. Field

Embodiments of the present disclosure relate to a light emitting display device, and particularly relate to a light emitting display device for reducing a diffraction pattern.

2. Description of the Related Art

A display device represents a device for displaying images on a screen, and it may be a liquid crystal display (LCD) and an organic light emitting diode display (OLED). The display device is utilized in one or more suitable electronic devices such as portable phones, GPSs, digital cameras, electronic books, portable game devices, or one or more suitable terminals.

The display device such as an organic light emitting device uses a flexible substrate so that the display device may be bent or folded.

Further, optical elements such as a camera or a photosensor are formed in a bezel area that is around a display area in small electronic devices such as portable phones, and methods for increasing a size of a displaying screen, gradually reducing a size of a peripheral area of the display area, and positioning the camera or the photosensor on a rear side of the display area are developed.

The above information disclosed in this Background section is only for enhancement of understanding of the background of the described technology, and therefore it may contain information that does not form the prior art to a person of ordinary skill in the art.

SUMMARY

Aspects of embodiments are directed toward a light emitting display device that has been made in an effort to reduce a diffraction pattern generated when external light is reflected.

Aspects of embodiments are directed toward a light emitting display device that has been made in an effort to reduce a reflection rate of external light or increase scratch intensity.

Additional aspects will be set forth in part in the description which follows and, in part, will be apparent from the description, or may be learned by practice of the presented embodiments of the disclosure.

According to one or more embodiments, a light emitting display device including: a substrate; an anode disposed on the substrate; a pixel defining layer having an opening overlapping the anode; an emission layer disposed in the opening of the pixel defining layer; a spacer disposed on the pixel defining layer and having a step; a cathode formed in the emission layer, the pixel defining layer, and the spacer; an encapsulation layer disposed on the cathode; and a light blocking layer disposed on the encapsulation layer, wherein the spacer includes a first portion and a second portion that is lower than the first portion and is integrally formed with the first portion, and the first portion and the second portion of the spacer overlaps the light blocking layer in a plan view.

According to one or more embodiments, the spacer may be made of a transparent photosensitive polyimide (PSPI) or a positive-type or kind photosensitive organic material, and the pixel defining layer may include a light blocking material, and may be made of a negative-type or kind black organic material.

According to one or more embodiments, the spacer may include a separator with a concave groove structure.

According to one or more embodiments, the groove structure of the separator of the spacer may be formed up to the pixel defining layer and the pixel defining layer may include an additional separator.

According to one or more embodiments, the light emitting display device may further include a functional layer disposed above the pixel defining layer and the spacer and below the cathode, wherein the functional layer may include a first functional layer disposed between the anode and the emission layer and a second functional layer disposed between the emission layer and the cathode, and at least one of the first functional layer or the second functional layer may be disconnected by the separator.

According to one or more embodiments, the emission layer may include a first emission layer and a second emission layer, may further include an intermediate connecting layer disposed between the first emission layer and the second emission layer; and a functional layer disposed between the anode and the first emission layer, between the first emission layer and the intermediate connecting layer, between the intermediate connecting layer and the second emission layer, and between the second emission layer and the cathode, and part of the functional layer may be disconnected by the separator.

According to one or more embodiments, the separator may include an opening corresponding portion formed along at least part of an opening of the pixel defining layer.

According to one or more embodiments, the separator may further include an extension extending from the opening corresponding portion.

According to one or more embodiments, the pixel defining layer may include a separator with a concave groove structure.

According to one or more embodiments, the spacer may be disposed inside the separator in a plan view, and the separator may not overlap the spacer in a plan view.

According to one or more embodiments, the light emitting display device may further include a sensing insulating layer and a sensing electrode disposed on the encapsulation layer; and a color filter or a reflection adjusting layer disposed in an opening of the light blocking layer.

According to one or more embodiments, a light emitting display device including: a main display area and a second component area corresponding to an optical element disposed on a rear side, wherein the second component area includes a unit pixel including a plurality of light emitting diodes, a component spacer disposed among the light emitting diodes included in the unit pixel, and a light transmitting region disposed around the unit pixel, the component spacer has a T shape, and the component spacer includes a first portion and a second portion that is lower than the first portion and is integrally formed with the first portion.

According to one or more embodiments, the unit pixel may further include a pixel defining layer including a plurality of openings, wherein the openings of the pixel defining layer may correspond to the light emitting diodes included in the unit pixel one on one, and the component spacer may be disposed on the pixel defining layer.

According to one or more embodiments, the light emitting display device may further include a light blocking layer having openings overlapping the respective openings of the pixel defining layer, wherein the entire component spacer may overlap the light blocking layer in a plan view.

According to one or more embodiments, the component spacer may be made of a photosensitive polyimide (PSPI) or a positive-type or kind photosensitive organic material, and the pixel defining layer may include a light blocking material and may be made of a negative-type or kind black organic material.

According to one or more embodiments, the unit pixel may include three light emitting diodes, a first light emitting diode may be lengthily disposed on a left, and a second light emitting diode and a third light emitting diode may be disposed top to bottom on a right.

According to one or more embodiments, the component spacer may be disposed among the first to third light emitting diodes, and the component spacer may have a T shape rotated by 90 degrees in a counterclockwise direction.

According to one or more embodiments, the first portion of the component spacer may have a T shape rotated by 90 degrees in the counterclockwise direction.

According to one or more embodiments, the second portion of the component spacer may be disposed on respective sides of the first portion.

According to one or more embodiments, ends of the first portion and the second portion of the component spacer may correspond to each other.

According to one or more embodiments, the spacer positioned on the pixel defining layer is disposed to be covered by the light blocking layer so the diffraction pattern generated by interference of the light reflected from the pixel defining layer and the light reflected from the spacer may not be generated.

According to one or more embodiments, the ratio of reflecting external light may be reduced by utilizing the black pixel defining layer for separating the emission layer instead of the polarizer. The spacer having the step is formed on the black pixel defining layer for separating the emission layer to thus increase the scratch intensity and reduce the generation rate of dark spot defects according to the pressing pressure.

BRIEF DESCRIPTION OF THE DRAWINGS

FIG. 10 shows a table of comparing a configuration and a reflection characteristic according to a comparative example and the present embodiment.

DETAILED DESCRIPTION

Figure 1:
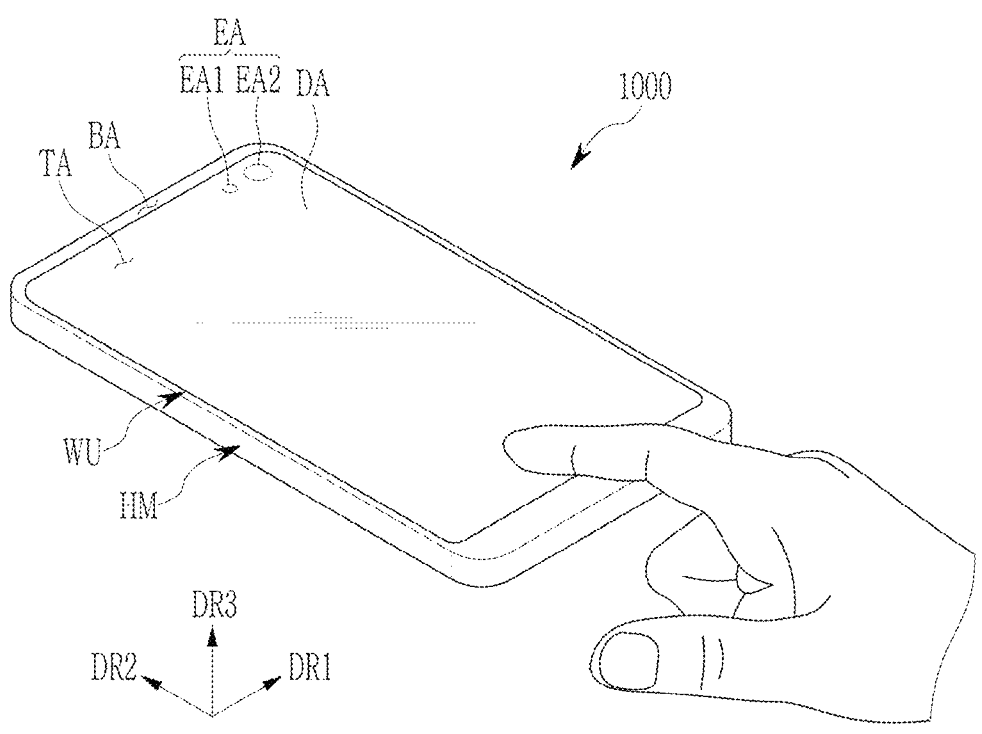
FIG. 1 shows a perspective view of a utilizing state of a display device according to an embodiment.

The present disclosure will be described more fully hereinafter with reference to the accompanying drawings, in which example embodiments of the present disclosure are shown. As those skilled in the art would realize, the described embodiments may be modified in one or more suitable different ways, all without departing from the spirit or scope of the present disclosure.

Parts that are irrelevant to the description will not be provided to clearly describe the present disclosure, and the same elements will be designated by the same reference numerals throughout the specification.

The size and thickness of each configuration shown in the drawings are arbitrarily shown for better understanding and ease of description, but the present disclosure is not limited thereto. The thicknesses of layers, films, panels, regions, etc., are enlarged for clarity. The thicknesses of some layers and areas are exaggerated for convenience of explanation.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" refers to positioned on or below the object portion, and does not necessarily refer to positioned on the upper side of the object portion based on a gravitational direction.

Spatially relative terms, such as "beneath", "below", "lower", "downward", "above", "upper", "left", "right", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Unless explicitly described to the contrary, the word "comprise", and variations such as "comprises" or "comprising", will be understood to imply the inclusion of stated elements but not the exclusion of any other elements.

The phrase "in a plan view" refers to viewing the object portion from the top, and the phrase "in a cross-sectional view" refers to viewing a cross-section of which the object portion is vertically cut from the side.

Throughout the specification, when it is described that a part is "connected (in contact with, coupled)" to another part, the part may be "directly connected" to the other element, may be "connected" to the other part through a third part, or may be connected to the other part physically or electrically, and they may be referred to by different titles depending on positions or functions, but respective portions that are substantially integrated into one body may be connected to each other.

As utilized herein, the term "and/or" includes any and all combinations of one or more of the associated listed items. Throughout the disclosure, the expression "at least one of a, b or c", "at least one of a-c", "at least one of a to c", "at least one of a, b, and/or c", etc., indicates only a, only b, only c, both (e.g., simultaneously) a and b, both (e.g., simultaneously) a and c, both (e.g., simultaneously) b and c, all of a, b, and c, or variations thereof.

In the present specification, "including A or B", "A and/or B", etc., represents A or B, or A and B.

When the parts such as wires, layers, films, regions, plates, or constituent elements are described to extend in the "first direction or the second direction", this not only signifies a straight-line shape running straight in a corresponding direction, but also includes a structure generally extending in the first direction or the second direction, a structure bent on a set or predetermined portion, a zigzag-shaped structure, or a structure including a curved structure and extending.

Electronic devices (e.g., mobile phones, TVs, monitors, laptop computers, etc.,) including the display device and the display panel described in the present specification or the electronic devices including the display device and the display panel manufactured by a manufacturing method described in the specification are not excluded from the claimed range of the present specification.

As used herein, the term "substantially," "about," and similar terms are used as terms of approximation and not as terms of degree, and are intended to account for the inherent deviations in measured or calculated values that would be recognized by those of ordinary skill in the art. "About" or "substantially", as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" or "substantially" may mean within one or more standard deviations, or within ±30%, 20%, 10%, 5% of the stated value.

The display device and/or any other relevant devices or components according to embodiments of the present invention described herein may be implemented utilizing any suitable hardware, firmware (e.g. an application-specific integrated circuit), software, or a combination of software, firmware, and hardware. For example, the various components of the device may be formed on one integrated circuit (IC) chip or on separate IC chips. Further, the various components of the [device] may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

A structure of a display device will now be described with reference to FIG. 1 to FIG. 3.

Figure 2:
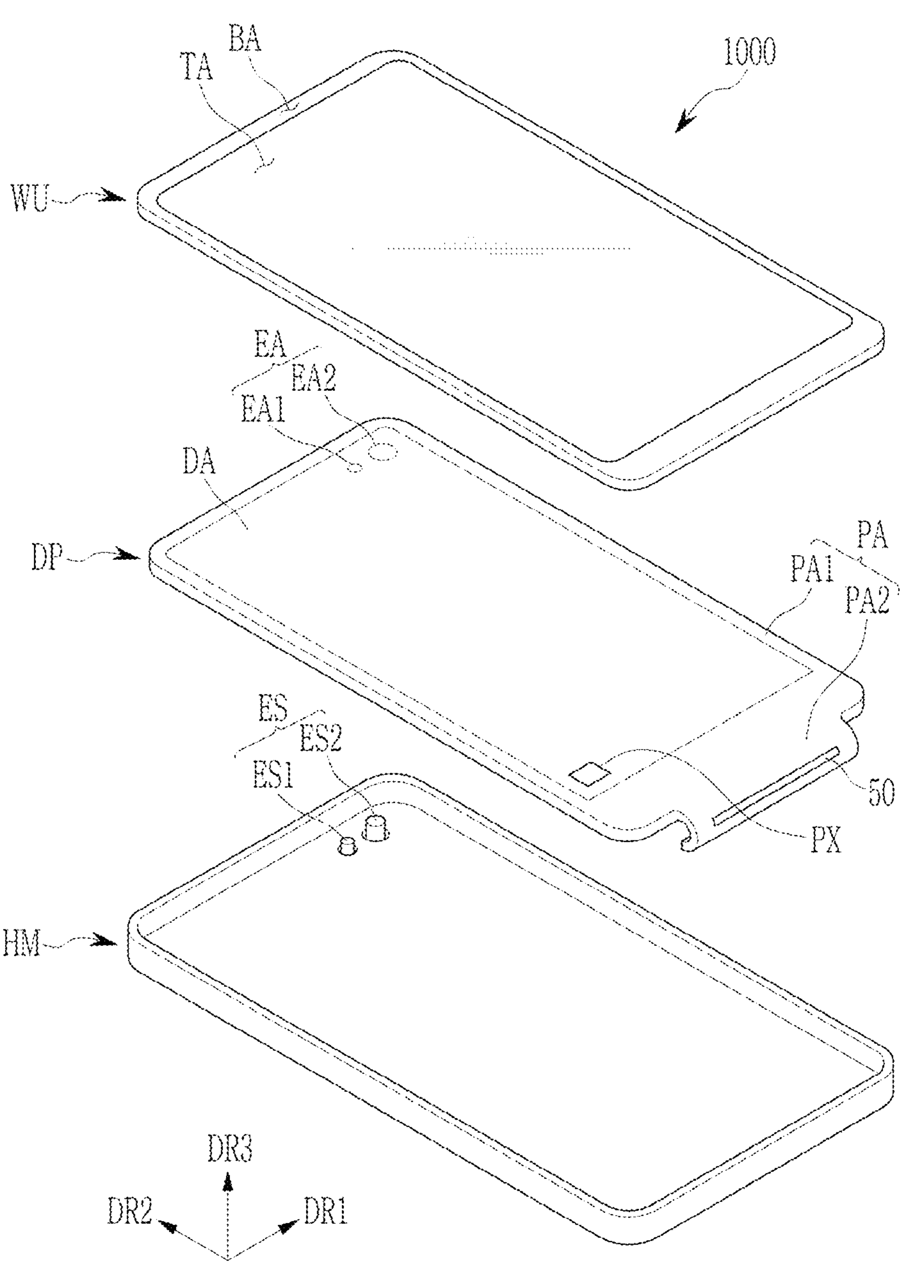
FIG. 2 shows an exploded perspective view of a display device according to an embodiment.
Figure 3:
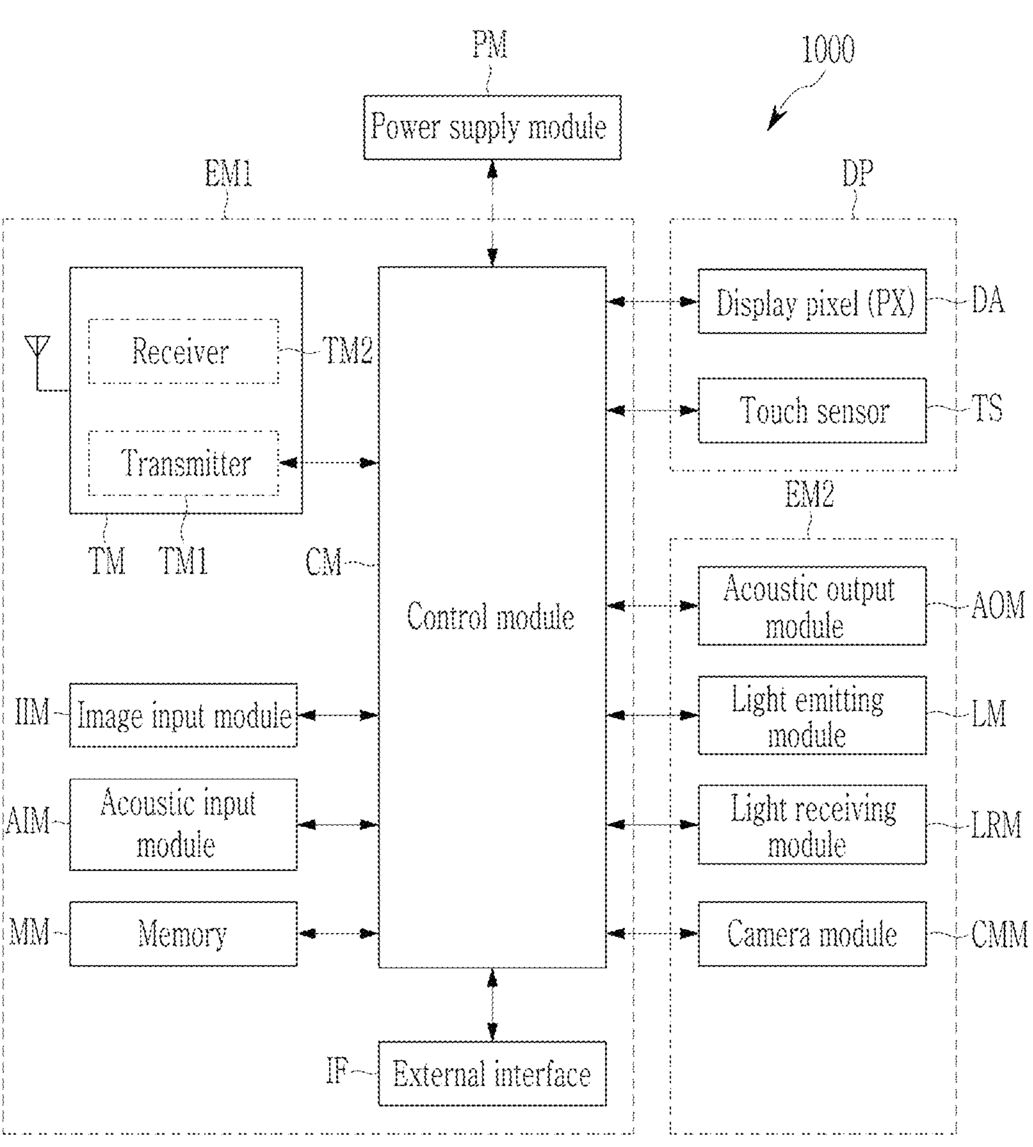
FIG. 3 shows a block diagram of a display device according to an embodiment.

FIG. 1 shows a perspective view of a utilizing state of a display device according to an embodiment, FIG. 2 shows an exploded perspective view of a display device according to an embodiment, and FIG. 3 shows a block diagram of a display device according to an embodiment.

Referring to FIG. 1, the display device 1000 according to an embodiment displays videos or still images, and is usable as a displaying screen of one or more suitable types (kinds) of products such as televisions, laptops, monitors, billboards, or the internet of things (IOT) in addition to portable electronic devices such as mobile phones, smartphones, tablet personal computers (PC), mobile communication terminals, electronic organizers, electronic books, portable multimedia players (PMP), global positioning systems (GPS), or ultra mobile PCs (UMPC). The display device 1000 may be utilized to wearable devices such as smart watches, watch phones, glasses-type or kind displays, or head mounted displays (HMD). The display device 1000 may be utilized as a dashboard of a vehicle, a center information display (CID) disposed on a center fascia or a dashboard of a vehicle, a room mirror display replacing a side-view mirror of a vehicle, and a display disposed on a rear side of a front seat as an entertainment for a back seat of a vehicle. FIG. 1 shows that a display device 1000 is utilized as a smartphone for better comprehension and ease of description.

The display device 1000 may display images on display sides that are parallel to a first direction DR1 and a second direction DR2 toward a third direction DR3. A displaying side on which images are displayed may correspond to a front surface of the display device 1000 and may correspond to a front surface of the cover window WU. The images may include videos and still images.

In the present embodiment, front surfaces (or upper sides) and rear sides (or lower sides) of respective members are defined with respect to the image displaying direction. The front surface and the rear side may oppose each other in the third direction DR3, and normal directions of the front surface and the rear side may be parallel to the third direction DR3. A spaced distance between the front surface and the rear side in the third direction DR3 may correspond to a thickness of the display panel in the third direction DR3.

The display device 1000 may sense an input (refer to a hand shown in FIG. 1) of a user applied from an outside. The input of the user may include one or more suitable types (kinds) of external inputs such as part of the user body, light, heat, or pressure. In an embodiment, the input of the user is shown to be a hand of the user applied to the front surface. However, the present disclosure is not limited thereto. The input of the user may be provided in one or more suitable forms, and the display device 1000 may sense the input of the user applied to a lateral side of a rear side of the display device 1000 according to a configuration of the display device 1000.

Referring to FIG. 1 and FIG. 2, the display device 1000 may include a cover window WU, a housing HM, a display panel DP, and an optical element ES. In an embodiment, the cover window WU may be combined to the housing HM to configure an exterior of the display device 1000.

The cover window WU may include an insulating panel. For example, the cover window WU may be configured with glass, plastic, or a combination thereof.

The front surface of the cover window WU may define a front surface of the display device 1000. The transmission area TA may be an optically transparent region. For example, the transmission area TA may have visible ray transmittance of equal to or greater than about 90%.

The blocking area BA may define a shape of the transmission area TA. The blocking area BA may be disposed near the transmission area TA and may surround the transmission area TA. The blocking area BA may have light transmittance that is relatively lower than light transmittance of the transmission area TA. The blocking area BA may include an opaque material for blocking light. The blocking area BA may have a set or predetermined color. The blocking area BA may be defined by a bezel layer provided in addition to a transparent substrate for defining the transmission area TA, or may be defined by an ink layer inserted into or colored to the transparent substrate.

The display panel DP may include a display pixel PX for displaying images and a driver 50, and the display pixel PX is positioned in a display area DA and a component area EA. The display panel DP may include a front surface including a display area DA and a non-display area PA. In an embodiment, the display area DA and the component area EA include pixels and display images, and a touch sensor is positioned on an upper side in the third direction DR3 of the pixel and may sense external inputs.

The transmission area TA of the cover window WU may at least partly overlap the display area DA and the component area EA of the display panel DP. For example, the transmission area TA may overlap the front surfaces of the display area DA and the component area EA, or may overlap at least part of the display area DA and the component area EA. Accordingly, the user may watch the images through the transmission area TA or may provide external inputs based on the images. However, the present disclosure is not limited thereto. For example, the area in which the images are displayed may be separated from the area in which the external inputs are sensed.

The non-display area PA of the display panel DP may at least partly overlap the blocking area BA of the cover window WU. The non-display area PA may be covered by the blocking area BA. The non-display area PA may be disposed near the display area DA, and may surround the display area DA. The non-display area PA displays no images, and a driving circuit for driving the display area DA or driving wires may be disposed. The non-display area PA may include a first peripheral area PA1 positioned outside the display area DA, and a second peripheral area PA2 including a driver 50, a connecting wire, and a bending area. In an embodiment given with reference to FIG. 2, the first peripheral area PA1 is position on one side of the display area DA, and the second peripheral area PA2 is positioned on another side of the display area DA.

In an embodiment, the display panel DP may be assembled in a planar state so that the display area DA, the component area EA, and the non-display area PA may face the cover window WU. However, the present disclosure is not limited thereto. Part of the non-display area PA of the display panel DP may be bent. Here, a portion of the non-display area PA may face the rear side of the display device 1000 so the blocking area BA visible at the front surface of the display device 1000 may be reduced, and in FIG. 2, the second peripheral area PA2 may be bent, may be positioned on the rear side of the display area DA, and may then be assembled.

The component area EA of the display panel DP may include a first component area EA1 and a second component area EA2. The component area EA1 and the second component area EA2 may be at least partly surrounded by the display area DA. The first component area EA1 and the second component area EA2 are shown to be spaced from each other, and without being limited thereto, at least part thereof may be connected to each other. Optical elements (refer to ES of FIG. 2; also referred to as components) utilizing infrared rays, visible ray, or acoustic sound may be disposed below the first component area EA1 and the second component area EA2.

A plurality of light emitting diodes LED, and a plurality of pixel circuits for generating light emitting currents and transmitting them to the light emitting diodes LED are formed in the display area (DA; also referred to as a main display area) and the component area EA. Here, one light emitting diode and one pixel circuit configures a pixel PX. One pixel circuit and one light emitting diode may be formed one to one in the display area DA and the component area EA.

The first component area EA1 may include a display unit including a transmitter through which light or/and acoustic sound are transmitted and a plurality of pixels. The transmitter is positioned between the adjacent pixels and is configured to be a layer through which light or/and acoustic sound are transmitted. The transmitter may be positioned between the adjacent pixels, and a layer through which light is not transmitted such as a light blocking layer may overlap the first component area EA1 depending on embodiments. The pixel number per area (also referred to as resolution) of the pixels (also referred to as normal pixels) included in the display area DA may be equal to the pixel number per area of the pixels (also referred to as first component pixels) included in the first component area EA1.

The second component area EA2 includes a region (also referred to as a light transmitting region) configured with a transparent layer through which light transmits, and the light transmitting region may have a configuration in which a conductive layer or a semiconductor layer is not positioned, and the layer including a light blocking material, for example, the pixel defining layer and/or the light blocking layer includes an opening overlapping a position that corresponds to the second component area EA2. The pixel number per area of the pixels (also referred to as second component pixels) included in the second component area EA2 may be less than the pixel number per area of the normal pixels included in the display area DA. As a result, the resolution of the second component pixel may be less than the resolution of the normal pixels.

Referring to FIG. 3, the display panel DP may further include a touch sensor TS in addition to the display area DA including the display pixel PX. The display panel DP may include the pixel PX for generating images and may be visible to the user from the outside through the transmission area TA. The touch sensor TS may be positioned on an upper portion of the pixel PX, and may sense external inputs applied from the outside. The touch sensor TS may sense external inputs provided to the cover window WU.

Referring to FIG. 2, the second peripheral area PA2 may include a bending portion. The display area DA and the first peripheral area PA1 may have a planar state that is substantially parallel to a plane defined by the first direction DR1 and the second direction DR2, and one side of the second peripheral area PA2 may extend from the planar state, may pass through the bending portion, and may again have the planar state. As a result, at least part of the second peripheral area PA2 may be bent and may be assembled to be positioned on the rear side of the display area DA. When the at least part of the second peripheral area PA2 is assembled, it overlaps the display area DA in a plan view so the blocking area BA of the display device 1000 may be reduced. However, the present disclosure is not limited thereto. For example, the second peripheral area PA2 may not be bent.

The driver 50 may be mounted in the second peripheral area PA2, may be mounted on the bending portion, or may be positioned on one of respective sides of the bending portion. The driver 50 may be provided as a chip.

The driver 50 may be electrically connected to the display area DA and the component area EA and may be configured to transmit electrical signals to the display area DA and the pixel of the component area EA. For example, the driver 50 provides data signals to the pixels PX disposed in the display area DA. In another way, the driver 50 may include a touch driving circuit, and may be electrically connected to touch sensor TS disposed in the display area DA and/or the component area EA. The driver 50 may be designed to include one or more suitable types (kinds) of circuits in addition to the above-noted circuits or provide one or more suitable electrical signals to the display area DA.

In some embodiments, regarding the display device 1000, a pad portion may be positioned at the end of the second peripheral area PA2, and may be electrically connected to a flexible printed circuit substrate (FPCB) including a driving chip by the pad portion. Here, the driving chip positioned on the flexible printed circuit substrate may include one or more suitable types (kinds) of driving circuits for driving the display device 1000 or a connector for supply a power voltage. Depending on embodiments, a rigid printed circuit board (PCB) may be utilized instead of the flexible printed circuit substrate.

The optical element ES may be disposed on a lower portion of the display panel DP. The optical element ES may include a first optical element ES1 overlapping the first component area EA1 and a second optical element ES2 overlapping the second component area EA2. The first optical element ES1 may utilize infrared rays, and in this instance, regarding the first component area EA1, a layer through which the light does not transmit such as the light blocking layer may overlap the first component area EA1.

The first optical element ES1 may be an electronic part utilizing light or acoustic sound. For example, the first optical element ES1 may be a sensor for receiving light and utilizing it such as an infrared ray sensor, a sensor for measuring distances or recognizing fingerprints by outputting and sensing light or acoustic sound, a small lamp for outputting light, or a speaker for outputting sound. It is obvious that the electronic parts utilizing light may also utilize light with one or more suitable wavelength bandwidths such as visible light, infrared rays, or ultraviolet rays.

The second optical element ES2 may be at least one of a camera, an infrared (IR) camera, a dot projector, an IR illuminator, or a time-of-flight (ToF) sensor.

Referring to FIG. 3, the display device 1000 may include a display panel DP, a power supply module PM, a first electronic module EM1, and a second electronic module EM2. The display panel DP, the power supply module PM, the first electronic module EM1, and the second electronic module EM2 may be electrically connected to each other. FIG. 3 exemplifies a display pixel and a touch sensor TS positioned in the display area DA from among the configuration of the display panel DP.

The power supply module PM may supply a power voltage for an entire operation of the display device 1000. The power supply module PM may include a battery module.

The first electronic module EM1 and the second electronic module EM2 may include one or more suitable types (kinds) of function modules for operating the display device 1000. The first electronic module EM1 may be mounted on a motherboard electrically connected to the display panel DP or may be mounted on an additional substrate, and may be electrically connected to the motherboard through a connector.

The first electronic module EM1 may include a control module CM, a radio communication module TM, an image input module IIM, an acoustic input module AIM, a memory MM, and an external interface IF. Some of the modules may not be mounted on the motherboard, and may be electrically connected to the motherboard through a flexible printed circuit substrate connected thereto.

The control module CM may control the entire operation of the display device 1000. The control module CM may be a microprocessor. For example, the control module CM may activate or de-activate the display panel DP. The control module CM may control other modules such as the image input module IIM or the acoustic input module AIM based on the touch signal received from the display panel DP.

The radio communication module TM may be configured to transmit/receive radio signal to/from other terminals by utilizing a Bluetooth or WiFi line. The radio communication module TM may be configured to transmit/receive voice signals by utilizing a general communication line. The radio communication module TM includes a transmitter TM1 for modulating signals and transmitting resultant signals, and a receiver TM2 for demodulating the received signals.

The image input module IIM may process image signals and may convert image data displayable to the display panel DP. The acoustic input module AIM may receive external acoustic signals by utilizing a microphone in a recording mode or a voice recognition mode and may convert them into electrical voice data.

The external interface IF may function as an interface connected to an external charger, a wired/wireless data port, or a card socket (e.g., a memory card or a SIM/UIM card).

The second electronic module EM2 may include an acoustic output module AOM, a light emitting module LM, a light receiving module LRM, and a camera module CMM, and at least part thereof is an optical element ES and may be positioned on the rear side of the display panel DP as shown in FIG. 1 and FIG. 2. The optical element ES may include a light emitting module LM, a light receiving module LRM, and a camera module CMM. The second electronic module EM2 may be mounted on the motherboard, or it may be mounted on an additional substrate and may be electrically connected to the display panel DP through a connector, or it may be electrically connected to the first electronic module EM1.

The acoustic output module AOM may convert the acoustic data received from the radio communication module TM or the acoustic data stored in the memory MM and may output resultant data.

The light emitting module LM may generate light and may output the light. The light emitting module LM may output infrared rays. For example, the light emitting module LM may include a LED element. For example, the light receiving module LRM may sense the infrared rays. The light receiving module LRM may be activated when the infrared rays that are equal to or greater than a set or predetermined level are sensed. The light receiving module LRM may include a CMOS sensor. When the infrared rays are output from the light emitting module LM, they may be reflected by an external subject (e.g., fingers or face of the user), and the reflected infrared rays may be input to the light receiving module LRM. The camera module CMM may image external stuff to obtain images.

In an embodiment, the optical element ES may additionally include a photosensor or a thermosensor. The optical element ES may sense the external subject received through the front surface or may provide sound signals such as voice to the outside through the front surface. The optical element ES may include a plurality of constituent elements, and is not limited to one embodiment.

Referring to FIG. 2, the housing HM may be combined to the cover window WU. The cover window WU may be disposed on the front surface of the housing HM. The housing HM may be combined with the cover window WU and may provide a set or predetermined receiving space. The display panel DP and the optical element ES may be accepted in a set or predetermined receiving space provided between the housing HM and the cover window WU.

The housing HM may include a material with relatively high rigidity. For example, the housing HM may include glass, plastic, or metal, or may include a plurality of frames and/or plates configured with a combination thereof. The housing HM may stably protect the constitutional elements of the display device 1000 received in an internal space from external impacts.

A structure of the display device 1000 according to another embodiment will now be described with reference to FIG. 4.

Figure 4:
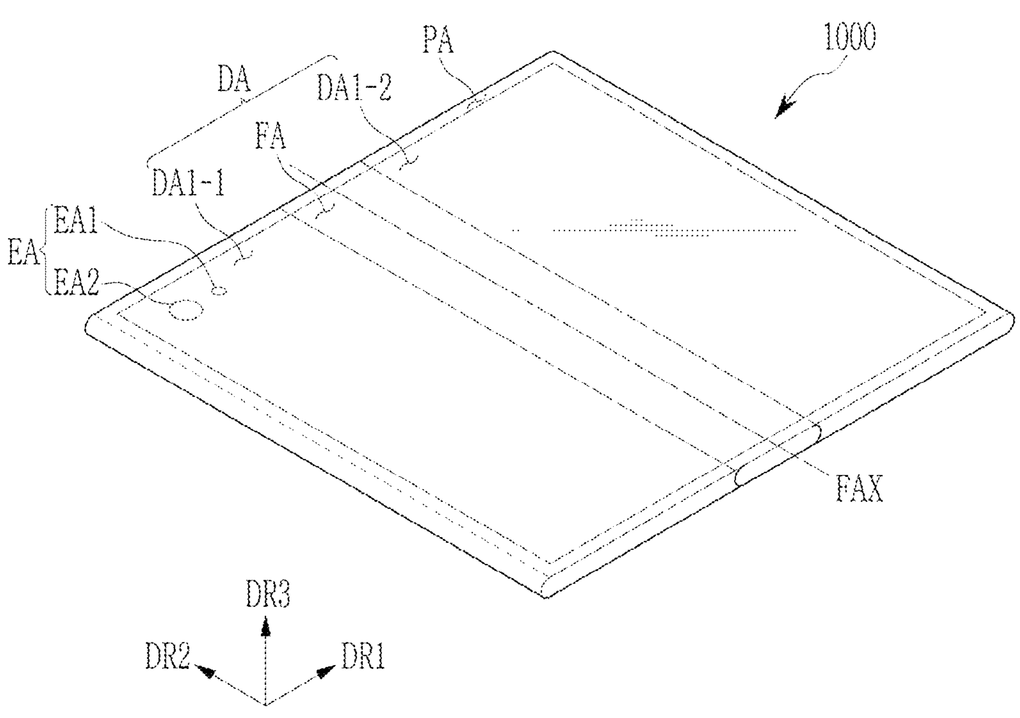
FIG. 4 shows a perspective view of a light emitting display device according to another embodiment.

FIG. 4 shows a perspective view of a light emitting display device according to another embodiment.

No same configurations as the above-noted constituent elements will be described, and an embodiment given with reference to FIG. 4 describes a foldable display device 1000 bent with respect to a folding axis FAX.

Referring to FIG. 4, in an embodiment, the display device 1000 may be the foldable display device. The display device 1000 may be bent outward or inward with respect to the folding axis FAX. When bent outward with respect to the folding axis FAX, a displaying side of the display device 1000 may be positioned outward in the third direction DR3 and the images may be displayed in both (e.g., simultaneously) directions. When bent inward with respect to the folding axis FAX, the displaying side may be invisible from the outside.

In an embodiment, the display device 1000 may include a display area DA, a component area EA, and a non-display area PA. The display area DA may be divided into a first-1 display area DA1-1, a first-2 display area DA1-2, and a folding area FA. The first-1 display area DA1-1 and the first-2 display area DA1-2 may be positioned on left and right sides of the folding axis FAX, and the folding area FA may be positioned between the first-1 display area DA1-1 and the first-2 display area DA1-2. In this instance, when folded outward with respect to the folding axis FAX, the first-1 display area DA1-1 and the first-2 display area DA1-2 are positioned on the respective sides in the third direction DR3 and may display images in both (e.g., simultaneously) directions. When folded inward with respect to the folding axis FAX, the first-1 display area DA1-1 and the first-2 display area DA1-2 may be invisible from the outside.

Figure 5:
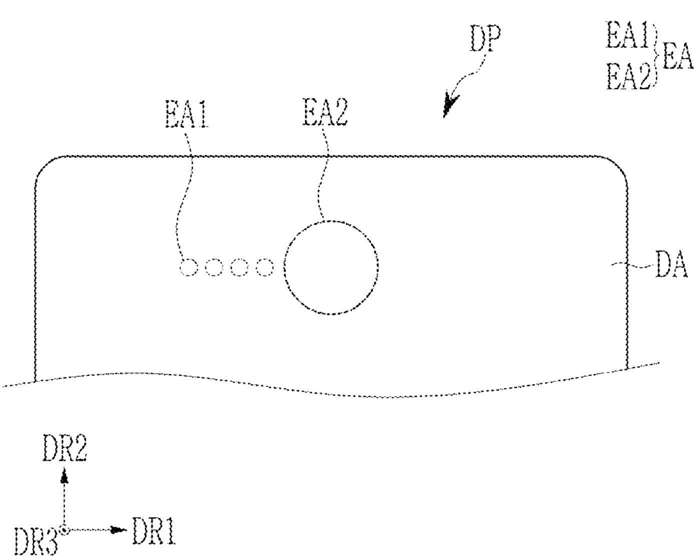
FIG. 5 shows a top plan view of an enlarged region of a light emitting display device according to an embodiment.

FIG. 5 shows a top plan view of an enlarged region of a light emitting display device according to an embodiment.

FIG. 5 shows a portion of the light emitting display panel DP in the light emitting display device by utilizing a display panel for a mobile phone according to an embodiment.

Regarding the light emitting display panel DP, the display area DA is positioned on the front surface, and the component area EA is positioned in the display area DA. In detail, the component area EA may include a first component area EA1 and a second component area EA2. In some embodiments, in an embodiment given with reference to FIG. 5, the first component area EA1 is positioned on a location that is near the second component area EA2. In an embodiment given with reference to FIG. 5, the first component area EA1 is positioned on the left of the second component area EA2. The position and the number of the first component area EA1 are changeable depending on embodiments. Referring to FIG. 5, the second optical element ES2 corresponding to the second component area EA2 may be a camera, and the first optical element ES1 corresponding to the first component area EA1 may be a photosensor.

A plurality of light emitting diodes LED, and a plurality of pixel circuits for generating light emitting currents and transmitting the same to the light emitting diodes LED, are formed in the display area DA. Here, one light emitting diode and one pixel circuit configure a pixel PX. One pixel circuit and one light emitting diode are formed one on one in the display area DA. The display area DA is also referred to as a normal display area. FIG. 5 does not show a structure of the light emitting display panel DP below a cutting line, and the display area DA may be positioned below the cutting line.

The light emitting display panel DP according to an embodiment may be distinguished into a lower panel layer and an upper panel layer. The lower panel layer includes light emitting diodes LED and pixel circuits configuring pixels, and may include an encapsulation layer (refer to 400 of FIG. 23). For example, the lower panel layer includes ranges from the substrate (refer to 110 of FIG. 23) to the encapsulation layer, also includes an anode, a pixel defining layer (refer to 380 of FIG. 23), an emission layer (refer to EML of FIG. 23), a spacer (refer to 385 of FIG. 23), a functional layer (refer to FL of FIG. 23), and a cathode (refer to Cathode of FIG. 23), and includes an insulating layer, a semiconductor layer, and a conductive layer between the substrate and the anode. The upper panel layer is positioned on an upper portion of the encapsulation layer, includes sensing insulating layers (refer to 501, 510, and 511 of FIG. 23) for sensing touches and a plurality of sensing electrodes (refer to 540 and 541 of FIG. 23), and may include a light blocking layer (refer to 220 of FIG. 23), a color filter (refer to 230 of FIG. 23), and a planarization layer (refer to 550 of FIG. 23).

The first component area EA1 may be configured with a transparent layer so that light may be transmitted, a conductive layer and a semiconductor layer may not be positioned so that light may be transmitted, a lower panel layer may have a photosensor region, and an opening (also referred to as an additional opening) may be formed on a position that corresponds to the first component area EA1 on a pixel defining layer of the upper panel layer, the light blocking layer, and the color filter layer to thus have a configuration that does not block or reduce light. In some embodiments, when the photosensor region is positioned on the lower panel layer and there is no opening that corresponds to the upper panel layer, it may be the display area DA and not the first component area EA1. One first component area EA1 may include a plurality of adjacent photosensor regions, and in this instance, the pixel provided near the photosensor region may be included in the first component area EA1. When the first optical element ES1 that corresponds to the first component area EA1 uses the infrared rays and not the visible rays, the first component area EA1 may overlap the light blocking layer 220 blocking the visible rays.

The second component area EA2 includes a second component pixel (refer to UPC of FIG. 20) and a light transmitting region (refer to UTA of FIG. 20), and a space between the second component pixel may be the light transmitting region. The second component area EA2 will be described in more detail in a later portion of the present specification with reference to FIG. 20 to FIG. 22.

In some embodiments, a peripheral area may be further positioned outside the display area DA. Further, FIG. 5 shows a display panel for a mobile phone, and the present embodiment is applicable to any types (kinds) of display panels with a rear side on which the optical element may be positioned, and it may be a flexible display device. In the case of the foldable display device from among the flexible display devices, the second component area EA2 and the first component area EA1 may be formed on positions that are different from the position shown in FIG. 5.

A configuration of the light emitting display panel DP and a configuration of the spacer 385 formed in the display area DA and/or the first component area EA1 will be described hereinafter with reference to FIG. 6 to FIG. 8.

The configuration of the light emitting display panel DP according to an embodiment will now be described with reference to FIG. 6.

Figure 6:
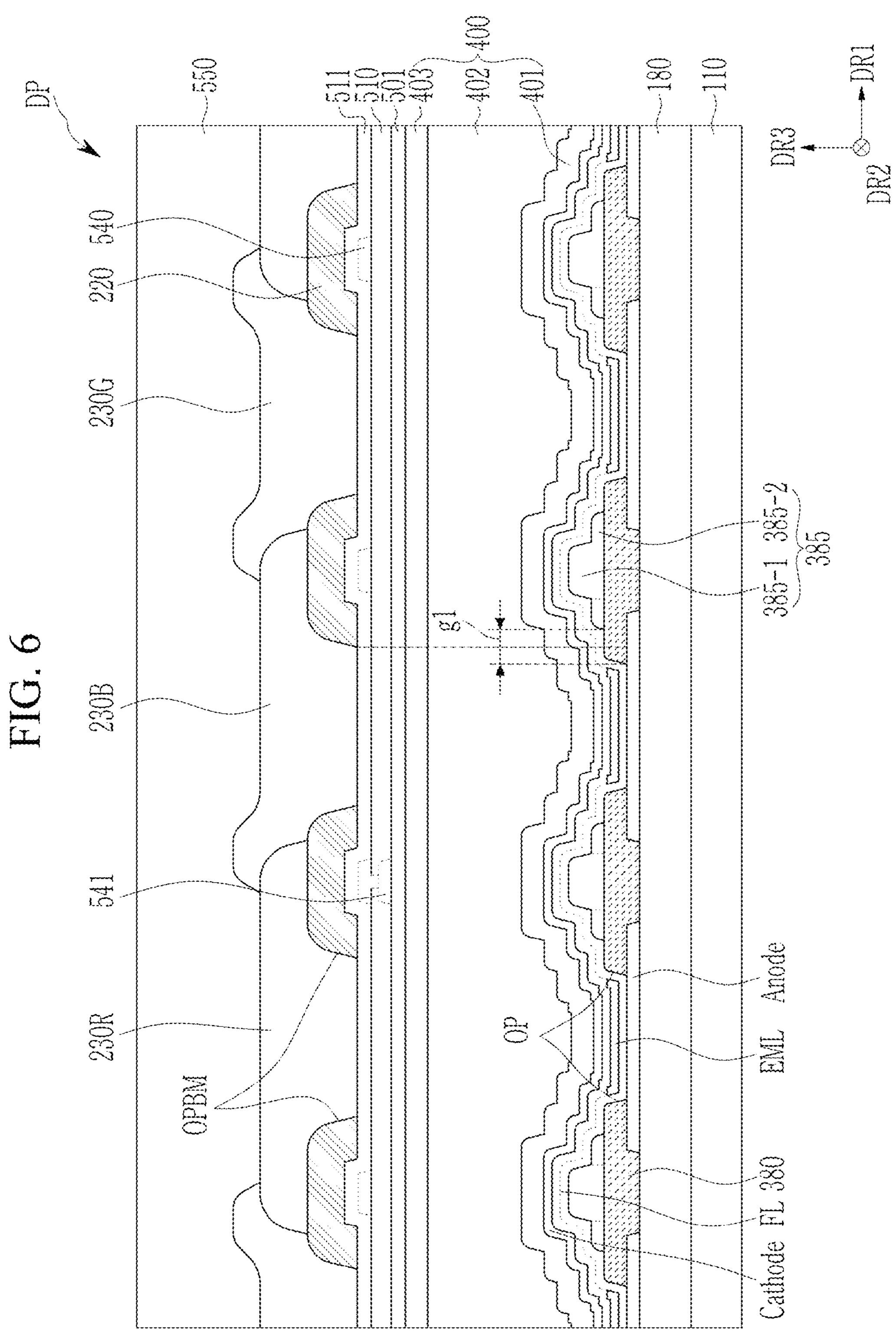
FIG. 6 shows a cross-sectional view of a display panel according to an embodiment.

FIG. 6 shows a cross-sectional view of a display panel according to an embodiment.

The light emitting display panel DP may display images by forming the light emitting diode on the substrate 110, may sense touches by including a plurality of sensing electrodes 540 and 541, and may include the light blocking layer 220 and the color filters 230R, 230G, and 230B to thus allow the light emitted by the light emitting diode to have color characteristics of the color filters 230R, 230G, and 230B.

Regarding the light emitting display panel DP shown in FIG. 6, a pixel defining layer 380 (also referred to as a black pixel defining layer) for distinguishing the emission layer EML from among the light emitting diode is made of a black color organic material including a light blocking material, and a spacer 385 (also referred to as a main spacer) with steps is formed on the pixel defining layer 380. A first portion 385-1 (also referred to as a first main spacer) that is high, and a second portion 385-2 (also referred to as a second main spacer) that is lower than the first portion 385-1 and is positioned around the first portion 385-1, are formed on the spacer 385. The first portion 385-1 and the second portion 385-2 may be integrally formed to each other. The spacer 385 may reduce a defect generation rate according to a pressing pressure by increasing scratch intensity to the light emitting display panel DP, and depending on embodiments, adherence to the functional layer FL positioned on the upper portion of the spacer 385 may be increased to prevent or reduce moisture and air from being injected from the outside. Further, great adherence may eliminate the problem that inter-layer adherence is reduced when the light emitting display panel DP has a flexible characteristic.

No polarizer is formed on the front surface of the light emitting display panel DP, but when the pixel defining layer 380 is formed thereon by utilizing a black organic material, and the light blocking layer 220 and the color filter 230 are formed on the upper portion to allow external light to be input to the inside, the external light may be reflected at the anode and may not be transmitted to the user.

The light emitting display panel DP will now be described in more detail.

The substrate 110 may include a material that has a rigid characteristic and is not bent such as glass, or may include a flexible material that is bent such as plastic or polyimide.

A plurality of thin film transistors are formed on the substrate 110, but they are omitted in FIG. 6, and an organic layer 180 for covering the thin film transistor is shown. One pixel includes a light emitting diode and a pixel circuit including a plurality of transistors and capacitors for transmitting light emitting currents to the light emitting diode. FIG. 6 shows no pixel circuit, and a configuration of the pixel circuit is modifiable depending on embodiments. FIG. 6 shows the organic layer 180 for covering the pixel circuit.

A light emitting diode including an anode, an emission layer EML, and a cathode is positioned on the organic layer 180.

The anode may be configured to be a single layer including a transparent conductive oxide film and a metal material or a multilayer including them. The transparent conductive oxide film may include an indium tin oxide (ITO), a poly-ITO, an indium zinc oxide (IZO), an indium gallium zinc oxide (IGZO), and an indium tin zinc oxide (ITZO), and the metal material may include silver (Ag), molybdenum (Mo), copper (Cu), gold (Au), and aluminum (Al).

The emission layer EML may be made of an organic light emitting material, and the adjacent emission layers EML may display different colors. Depending on embodiments, the respective emission layers EML may be configured to emit the same color of light because of the color filters 230R, 230G, and 230B positioned on the upper portion. Depending on embodiments, the emission layer EML may have a tandem structure in which a plurality of emission layers are stacked (refer to FIG. 25 (B)).

The pixel defining layer 380 is positioned on the organic layer 180 and the anode, an opening OP is formed in the pixel defining layer 380, the opening overlaps part of the anode, and the emission layer EML is positioned on the anode exposed by the opening OP. The emission layer EML may be positioned in the opening OP of the pixel defining layer 380, and it is distinguished from the adjacent emission layer EML by the pixel defining layer 380.

The pixel defining layer 380 may be made of an organic material expressing negative black. The black organic material may include a light blocking material, and the light blocking material may include a resin or a paste including carbon black, carbon nanotubes, a black dye, metal particles, for example, nickel, aluminum, molybdenum, and an alloy thereof, metal oxide particles (e.g., a chromium oxide), or metal nitride particles (e.g., a chromium nitride). The pixel defining layer 380 may include a light blocking material and may have a black color, and it may not reflect light but may be configured to absorb or block or reduce it. As the pixel defining layer 380 uses the negative organic material, the portion covered by a mask may be removed.

A spacer 385 is formed on the pixel defining layer 380. The spacer 385 includes a first portion 385-1 positioned in a high and narrow region and a second portion 385-2 positioned in a low and wide region. Referring to FIG. 6, the first portion 385-1 and the second portion 385-2 are spaced from each other according to a dotted line in the spacer 385. The first portion 385-1 may increase the scratch intensity to obtain rigidity on the pressing pressure. The second portion 385-2 may function as a contact support between the pixel defining layer 380 and the functional layer FL of the upper portion. The first portion 385-1 and the second portion 385-2 are made of the same material, they may be made of a positive photosensitive organic material, and for example, a photosensitive polyimide (PSPI) may be utilized. As they have the positive characteristic, the portion that is not covered by the mask may be removed. The spacer 385 may be transparent and may be configured to transmit and/or reflect light.

The pixel defining layer 380 may be formed to have the negative type or kind, and the spacer 385 may be formed to have the positive type or kind, and they may include the same type or kind of material depending on embodiments.

At least a portion of the upper side of the pixel defining layer 380 is covered by the spacer 385, and an edge of the second portion 385-2 is spaced from an edge of the pixel defining layer 380 so part of the pixel defining layer 380 is not covered by the spacer 385. The second portion 385-2 may cover the upper side of the pixel defining layer 380 on which the first portion 385-1 is not positioned to reinforce the adherence characteristic between the pixel defining layer 380 and the functional layer FL. In the present embodiment, the spacer 385 may be positioned in the region that overlaps the light blocking layer 220 to be described in a plan view so the spacer 385 may be covered by the light blocking layer 220 and may be invisible when seen from the front surface of the display panel DP.

A functional layer FL is positioned on the spacer 385 and the exposed pixel defining layer 380, and the functional layer FL may be formed on the front surface of the light emitting display panel DP or may be formed in the region excluding a set or predetermined area, for example, the light transmitting area UTA of the second component area EA2. The functional layer FL may include an electron injection layer, an electron transport layer, a hole transport layer, and a hole injection layer, and may be positioned above/below the emission layer EML. For example, the hole injection layer, the hole transport layer, the emission layer EML, the electron transport layer, the electron injection layer, and the cathode may be sequentially positioned on the anode so the hole injection layer and the hole transport layer from among the functional layer FL may be positioned on the lower portion of the emission layer EML, and the electron transport layer and the electron injection layer may be positioned on the upper portion of the emission layer EML.

The cathode may be made of a transparent electrode or a reflective electrode. Depending on embodiments, the cathode may be a transparent or semi-transparent electrode, and may be made of a metal thin film with a low work function. Also, the cathode made be made of or include lithium (Li), calcium (Ca), lithium fluoride/calcium (LiF/Ca), lithium fluoride/aluminum (LiF/Al), aluminum (Al), silver (Ag), and magnesium (Mg), and/or a compound thereof. A transparent conductive oxide (TCO) layer such as an indium tin oxide (ITO), an indium zinc oxide (IZO), a zinc oxide (ZnO), or an indium oxide ($In_2O_3$) may be further disposed on the metal thin film. The cathode may be integrally formed on the front surface of the light emitting display panel DP.

An encapsulation layer 400 is positioned on the cathode. The encapsulation layer 400 includes at least one inorganic film and at least one organic layer, and in FIG. 6, it has a triple-layered structure including a first inorganic encapsulation layer 401, an organic encapsulation layer 402, and a second inorganic encapsulation layer 403. The encapsulation layer 400 may protect the emission layer EML made of an organic material from moisture or oxygen input from the outside. Depending on embodiment, the encapsulation layer 400 may include a structure in which an inorganic layer and an organic layer are sequentially further stacked.

The sensing insulating layers 501, 510, and 511 and the sensing electrodes 540 and 541 are positioned on the encapsulation layer 400 to sense touches. In an embodiment given with reference to FIG. 6, the touch is sensed according to a capacitive type or kind by utilizing the two sensing electrodes 540 and 541, but depending on embodiments, the touch may be sensed according to a self-capacitive method by utilizing one sensing electrode. The sensing electrodes 540 and 541 may be insulated with the second sensing insulating layer 510 therebetween, the lower portion sensing electrode 541 is positioned on the first sensing insulating layer 501, the upper portion sensing electrode 540 is positioned on the second sensing insulating layer 510, and the upper portion sensing electrode 540 is covered by the third sensing insulating layer 511. The sensing electrodes 540 and 541 may be electrically connected through the opening positioned in the second sensing insulating layer 510. The sensing electrodes 540 and 541 may include a metal such as aluminum (Al), copper (Cu), silver (Ag), gold (Au), molybdenum (Mo), titanium (Ti), or tantalum (Ta), or one or more Pmetal alloys thereof, and may be configured to be a single layer or a multilayer.

The light blocking layer 220 and the color filters 230R, 230G, and 230B are positioned on the third sensing insulating layer 511.

The light blocking layer 220 may overlap the sensing electrodes 540 and 541 in a plan view, and may not overlap the anode in a plan view. This is to prevent or reduce the anode and the emission layer EML for displaying images from being covered by the light blocking layer 220 and the sensing electrodes 540 and 541.

Referring to FIG. 6, the light blocking layer 220 is positioned in the region overlapping the pixel defining layer 380 in a plan view, and one side of the light blocking layer 220 is indented from a corresponding one side of the pixel defining layer 380.

The light blocking layer 220 also has an opening OPBM, an area of the opening OPBM of the light blocking layer 220 is made greater than the opening OP of the pixel defining layer 380, and regarding the opening OP of the pixel defining layer 380, the light blocking layer 220 may be positioned in the opening OPBM in a plan view.

One side of the spacer 385 is indented from the corresponding one side of the pixel defining layer 380 by a set or predetermined gap g-1, and the spacer 385 is also indented from one side of the light blocking layer 220. As a result, when seen from the front surface of the display panel DP, the spacer 385 may be covered by the light blocking layer 220 and may be invisible.

The color filters 230R, 230G, and 230B are positioned on the sensing insulating layers 501, 510, and 511 and the light blocking layer 220. The color filters 230R, 230G, and 230B include a red color filter 230R for transmitting red light, a green color filter 230G for transmitting green light, and a blue color filter 230B for transmitting blue light. The respective color filters 230R, 230G, and 230B may overlap the anode of the light emitting diode in a plan view. Light emitted by the emission layer EML may pass through the color filter to be changed to the corresponding color and may be discharged so the light emitted by the emission layer EML may have the same color. However, the emission layer EML displays different colors, and may reinforce impressions of colors by allowing light to pass through the color filter with the same color.

The light blocking layer 220 may be positioned among the respective color filters 230R, 230G, and 230B. Depending on embodiments, the color filters 230R, 230G, and 230B may be replaced with color converting layers, or may further include the color converting layers. The color converting layers may include quantum dots.

A planarization layer 550 for covering the color filters 230R, 230G, and 230B are positioned on the color filters 230R, 230G, and 230B. The planarization layer 550 planarizes the upper side of the light emitting display panel, and it may be a transparent organic insulator including at least one material of a polyimide, a polyamide, an acryl resin, benzocyclobutene, and a phenol resin.

Depending on embodiments, a low refractive layer and an additional planarization layer may be further positioned on the planarization layer 550 to increase frontal visibility and light emitting efficiency of the display panel. The light may be refracted and discharged to the front surface by the low refractive layer and the additional planarization layer with a high refractive characteristic. In this case, depending on embodiments, the planarization layer 550 may not be provided, and the low refractive layer and the additional planarization layer may be positioned on the color filter 230.

In the present embodiment, no polarizer is included in the upper portion of the planarization layer 550. For example, the polarizer may prevent or reduce deterioration of displaying quality when external light is input, it is reflected at the anode, and the user sees it. However, the present embodiment includes a configuration in which a side of the anode is covered by the pixel defining layer 380 to reduce a reflecting degree at the anode, and the light blocking layer 220 is also formed to reduce the light input degree and thereby prevent or reduce deterioration of the display quality according to reflection. Therefore, the polarizer is not needed to be formed on the front surface of the light emitting display panel DP.

Configurations of the pixel defining layer 380, the spacer 385, and the light blocking layer 220 according to the present embodiment will now be described in more detail with reference to FIG. 7 and FIG. 8.

Figure 7:
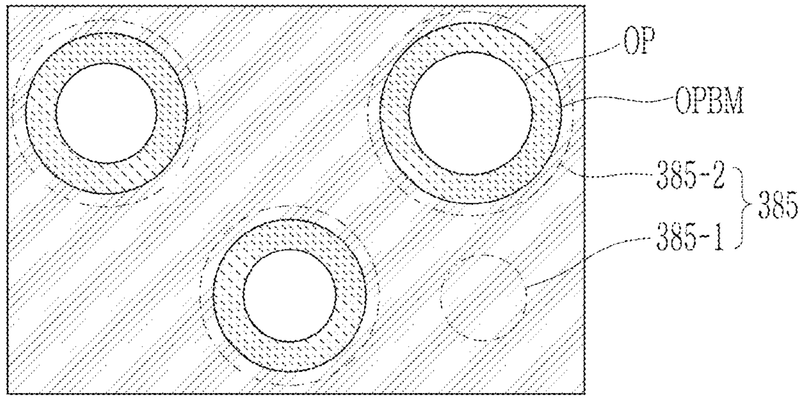
FIG. 7 shows a top plan view of a portion of a display panel according to an embodiment.
Figure 8:
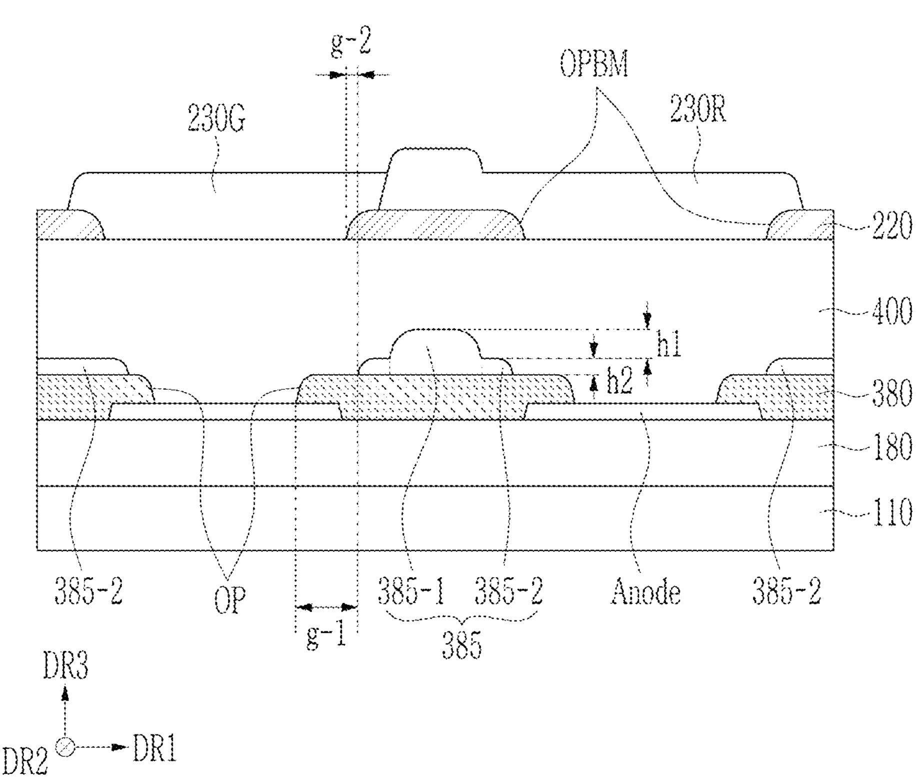
FIG. 8 shows a cross-sectional view of an enlarged portion of a display panel according to an embodiment.

FIG. 7 shows a top plan view of a portion of a display panel according to an embodiment, and FIG. 8 shows a cross-sectional view of an enlarged portion of a display panel according to an embodiment.

FIG. 7 and FIG. 8 do not provide the emission layer EML, the functional layer FL, and the cathode, however FIG. 8 additionally shows the light blocking layer 220 and the color filters 230R and 230G to clarify a relationship with the light blocking layer 220.

Planar configurations of the pixel defining layer 380, the spacer 385, and the light blocking layer 220 will now be described with reference to FIG. 7.

FIG. 7 shows the pixel defining layer 380 including an opening OP, the spacer 385 including a first portion 385-1 and a second portion 385-2 and the light blocking layer 220 including an opening OPBM. Referring to FIG. 7, the pixel defining layer 380 is positioned on the entire external side the opening OP, and the light blocking layer 220 is also positioned on the entire external side the opening OPBM. The spacer 385 is positioned on the external sides of the opening OP of the pixel defining layer 380 and the opening OPBM of the light blocking layer 220, and is positioned on the entire boundary outside of the second portion 385-2 of the spacer 385. Here, the first portion 385-1 of the spacer 385 is positioned on a corresponding portion, and the second portion 385-2 of the spacer 385 is positioned on an entire portion excluding a portion in which the first portion 385-1 of the spacer 385 is positioned from among the region in which the spacer 385 is positioned.

The first portion 385-1 of the spacer 385 is shown with a circular dotted line, a boundary of the second portion 385-2 of the spacer 385 contacts the pixel defining layer 380, and the opening OP and the light blocking layer 220 are shown outside the opening OPBM with dotted lines. The exposed upper side of the pixel defining layer 380 and the opening OP of the pixel defining layer 380 are positioned on the portion on which the second portion 385-2 of the spacer 385 is not positioned, and the emission layer EML is positioned in the opening OP of the pixel defining layer 380. As the second portion 385-2 of the spacer 385 is spaced from the opening OP of the pixel defining layer 380 by a set or predetermined horizontal distance g-1 (refer to FIG. 6), the spacer 385 may be entirely formed excluding the region in which the opening OP and the exposed black pixel defining layer 380 are positioned.

A portion of the light blocking layer 220 and the opening OPBM are positioned on the portion on which the second portion 385-2 of the spacer 385 is not positioned, in a plan view. As the light blocking layer 220 is positioned higher than the spacer 385, the spacer 385 is entirely covered by the light blocking layer 220, and the spacer 385 is invisible on the front surface by the light blocking layer 220. Hence, FIG. 7 shows the boundary of the first portion 385-1 and the second portion 385-2 of the spacer 385 with a dotted line.

A cross-sectional structure will now be described with reference to FIG. 8.

Referring to FIG. 8, the opening OP of the pixel defining layer 380 is positioned on the anode, and the opening OP overlaps part of the anode so a portion of the upper side of the anode is exposed. Although not shown in FIG. 8, the emission layer EML is positioned on the exposed anode and in the opening OP of the pixel defining layer 380. The pixel defining layer 380 is black so that light may not be reflected at one portion of the anode covered by the pixel defining layer 380. In another way, the emission layer EML may include different materials according to the displayed color, and hence, a size of the opening OP of the pixel defining layer 380 may be determined. Here, when the size of the opening OP of the pixel defining layer 380 is connected to a lifespan of the emission layer EML and the material of the emission layer EML is set, the opening OP may be formed with the size that is set considering the lifespan. A plurality of emission layers EML may be stacked in the opening OP of the pixel defining layer 380.

A spacer 385 with a step is formed on the pixel defining layer 380. The spacer 385 includes a first portion 385-1 positioned in a high and narrow region and a second portion 385-2 positioned in a low and wide region. The second portion 385-2 has a height that is above from the upper side of the pixel defining layer 380 by h2, and the first portion 385-1 has a height that is above from the upper side of the second portion 385-2 by h1 so it has the height of h1+h2 from the upper side of the pixel defining layer 380. The height h1+h2 of the first portion 385-1 may be about 1.5 μm, and the height h2 of the second portion 385-2 may be about 0.4 μm. Depending on embodiments, the height of the two spacers 385-1 and 385-2 may be diverse, and the height h2 of the second portion 385-2 may be less than the half of the height h1+h2 of the first portion 385-1. The height of the protrusion of the first portion 385-1, that is, the height difference h1 from the second portion 385-2 may be about 1.0 μm to about 1.4 μm, and the height h2 of the second portion 385-2 may be about 0.1 μm to about 0.5 μm. Depending on embodiments, the height difference h1 between the first portion 385-1 and the second portion 385-2 may be about 0.8 μm to about 1.0 μm. Depending on embodiments, the height h1+h2 of the first portion 385-1 may be about 1.1 μm to about 2.0 μm.

A horizontal gap between an edge of the second portion 385-2 and an edge of the pixel defining layer 380 is given as g-1 so the edges are spaced from each other. Here, the gap g-1 corresponds to an area that is not covered by the spacer 385 from among the area of the pixel defining layer 380 in a plan view. The gap g-1 has a value for the spacer 385 to be positioned more inside than the light blocking layer 220 to be described. Depending on embodiments, the gap g-1 may be about 5.7 μm. The gap g-1 is modifiable according to a size of the pixel, and the gap g-1 may have a value of 3 μm to 8 μm depending on embodiments. A ratio of the area that is not covered by the spacer 385 from among the area of the pixel defining layer 380 in a plan view may have the value of about 60% to about 80%.

According to the configuration of the spacer 385 with steps, scratch intensity is increased by the protruding structure of the first portion 385-1 and rigidity on the pressing pressure is obtained.

In some embodiments, the region that is wide in a like way (e.g., the region extending out of the first portion 385-1) of the second portion 385-2 and is not covered by the first portion 385-1 from among the upper side of the pixel defining layer 380 may also be covered to increase a contact characteristic between the pixel defining layer 380 and the functional layer FL of the upper portion and reinforce an interlayer contact force. As a result, adherence is increased to prevent or reduce moisture and air from being input from the outside. High adherence has the merit of removing the problem of degrading the interlayer adherence when the light emitting display panel DP has a flexible characteristic and is folded and unfolded. Here, the spacer 385 is made of a photosensitive polyimide (PSPI), and the pixel defining layer 380 may be made of a black organic material in a negative type or kind.

FIG. 8 shows a horizontal gap g-2 between the spacer 385 and the light blocking layer 220. The edge of the second portion 385-2 is positioned more inside than the edge of the light blocking layer 220 by g-2 so it is formed in the narrower region, and the spacer 385 is completely covered by the light blocking layer 220 in a plan view, and hence, it may not be seen from the upper portion. Further, the opening in the light blocking layer 220 is formed to be wider than the opening OP of the pixel defining layer 380 on which the emission layer EML is positioned, which aims the light emitted by the emission layer EML to emit to the lateral side with a set or predetermined angle. Depending on embodiments, a center and/or a center line of the light blocking layer 220, a center and/or a center line of the first portion 385-1 of the spacer 385, and a center and/or a center line of the pixel defining layer 380 may correspond to each other. Here, the center and the center line may be portions that are positioned at the same distance with respect to respective sides.

Characteristics of the embodiment given with reference to FIG. 6 to FIG. 8 will now be described with reference to FIG. 9 to FIG. 12.

A diffraction pattern generated by a reflection of external light will now be described with reference to FIG. 9 to FIG. 11.

Figure 9:
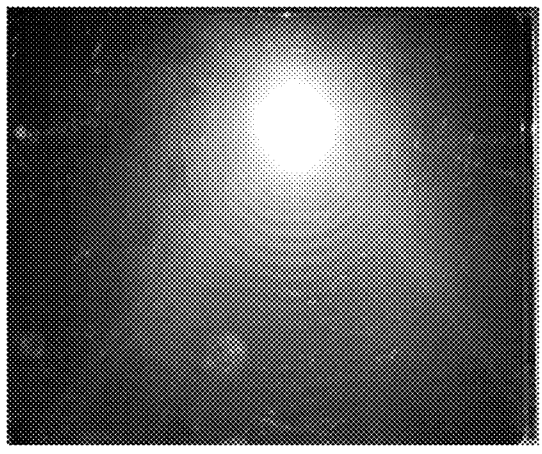
FIG. 9 shows an image of a reflection characteristic of a display panel according to an embodiment.
Figure 11:
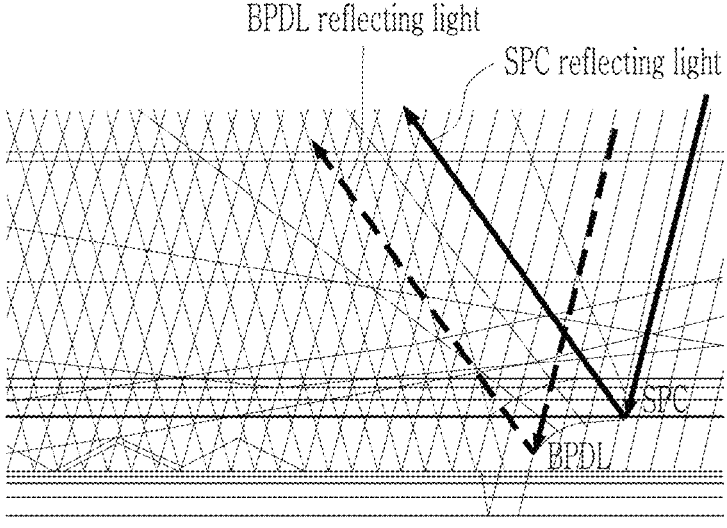
FIG. 11 shows a cause of generation of a diffraction pattern.

FIG. 9 shows an image of a reflection characteristic of a display panel according to an embodiment, FIG. 10 shows a table of comparing a configuration and a reflection characteristic according to a comparative example and the present embodiment, and FIG. 11 shows a cause of generation of a diffraction pattern.

FIG. 9 shows an image of light reflected at a display panel when intense external light is irradiated according to an embodiment given with reference to FIG. 6 to FIG. 8. Referring to FIG. 9, it is found that the diffraction pattern in which rings are disposed at regular gaps. In the present embodiment, no polarizer is formed on the upper portion of the display panel so when intense external light is irradiated, the diffraction pattern caused by reflected light may be easily seen. Therefore, there is a need to generate the diffraction pattern as less as possible, and for this purpose, the spacer 385 is disposed inside the light blocking layer 220 in a plan view so that the external light may not be reflected at the spacer 385 in the present embodiment.

To confirm whether the present embodiment less generates the diffraction pattern of external light and what merits it has, one embodiment and three comparative examples will be compared with reference to FIG. 10.

FIG. 10 additionally shows Comparative Example 1, Comparative Example 2, and Comparative Example 3, and the embodiment described with reference to FIG. 6 to FIG. 8 is also shown to be compared.

A cross-sectional structure and a planar structure will be compared, and the embodiment of FIG. 10 has been described with reference to FIG. 6 to FIG. 8 so the configurations of Comparative Example 1, Comparative Example 2, and Comparative Example 3 will now be described in more detail.

Regarding Comparative Example 1, the first portion 385-1 of the spacer 385 has the same size and position, and the second portion 385-2 protrudes outside the light blocking layer 220 in a plan view, so when seen from the above, there is a portion in which the second portion 385-2 of the spacer 385 is not covered by the light blocking layer 220. The second portion 385-2 of the spacer 385 does not cover the entire pixel defining layer 380. Hence, when seen from the above, the upper layer of the pixel defining layer 380, the second portion 385-2 of the spacer 385, and the light blocking layer 220 may be confirmed.

Comparative Example 2 shows that the second portion 385-2 of the spacer 385 protrudes to the outside of the light blocking layer 220 and covers the entire upper side of the pixel defining layer 380 so when seen from the above, the pixel defining layer 380 is invisible.

According to Comparative Example 1 and Comparative Example 2, in a like way of the embodiment given with reference to FIG. 6 to FIG. 8, the pixel defining layer 380 is made of a black organic material, the spacer 385 is made of a photosensitive polyimide (PSPI), and the light blocking layer 220 is made of a black organic material.

Comparative Example 3 shows that the pixel defining layer 380 and the spacer 385 are made of a black organic material, and the light blocking layer 220 is made of a black organic material. Regarding Comparative Example 3, the spacer 385 does not have the second portion, and may have the high first portion. Regarding Comparative Example 3, when seen from the above, the upper layer of the pixel defining layer 380 and the light blocking layer 220 are visible, the spacer 385 is unseen, and the photosensitive polyimide (PSPI) is invisible.

The photographed diffraction patterns according to the above-structured Comparative Example 1, Comparative Example 2, and Comparative Example 3 and the embodiments given with FIG. 6 to FIG. 8 will now be compared.

Comparative Example 1 shows the biggest diffraction pattern, Comparative Example 3 shows the second biggest diffraction pattern, and Comparative Example 2 and the embodiment of FIG. 6 to FIG. 8 show similar diffraction patterns.

FIG. 11 shows a cause that the diffraction pattern is generated. Light provided from the outside is reflected at the upper side of the pixel defining layer 380 (marked as BPDL in FIG. 11) that is not covered by the light blocking layer 220 and the upper side of the spacer 385 (marked as SPC in FIG. 11). The light reflected at the respective portions may interfere with each other, thereby generating the diffraction patterns. For example, the spacer 385 and the light blocking layer 220 have different substances, different surface characteristics, and different curvatures of the upper sides so the light reflected from two portions may interfere with each other with a high possibility, and hence the diffraction patterns may be easily generated. This may be confirmed from it that Comparative Example 1 has the biggest diffraction pattern. For example, the pixel defining layer 380 is covered with the spacer 385, and light is reflected at the spacer 385 so there are a relatively less number of diffraction patterns according to Comparative Example 2, and there is no transparent layer made of a polyimide (PSPI) and there are a relatively less number of diffraction patterns according to Comparative Example 3. Further, it is also found in the present embodiment that the spacer 385 is positioned inside the light blocking layer 220 in a plan view and no external light is reflected at the spacer 385 so there are a relatively less number of diffraction patterns.

When the diffraction pattern of FIG. 10 is compared, Comparative Example 2 and the embodiment of FIG. 6 to FIG. 8 have similar diffraction patterns so when the diffraction patterns are considered, Comparative Example 2 may be utilized. However, differing from Comparative Example 2, the embodiment given with FIG. 6 to FIG. 8 may form the pixel defining layer 380 with a black color organic material, and may be configured to absorb incident external light to prevent or reduce it from being reflected. Hence, it has the merit of reducing the problem caused by the reflection of external light.

The scratch intensity will now be described with reference to FIG. 12.

Figure 12:
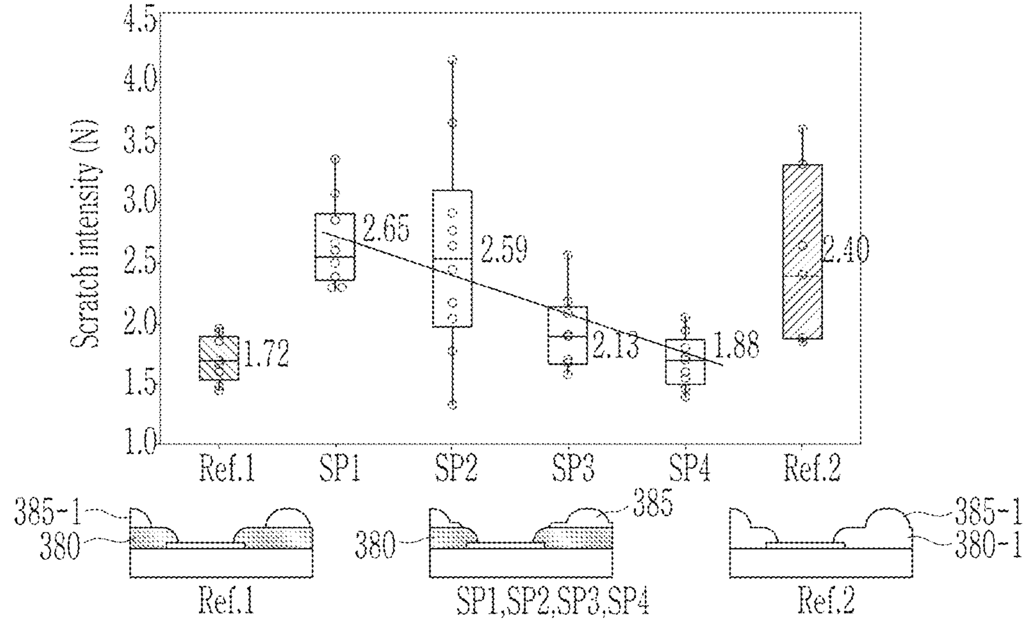
FIG. 12 shows a graph of changes of scratch intensity according to a structure of a spacer according to a comparative example and an embodiment.

FIG. 12 shows a graph of changes of scratch intensity according to a structure of a spacer according to a comparative example and an embodiment.

FIG. 12 shows results of testing scratch intensity as a graph, and shows numerical values marked next to respective bar graphs represent averages of the scratch intensities of the corresponding example.

FIG. 12 includes two Comparative Examples Ref.1 and Ref.2, and compares the scratch intensities, and the configurations of Comparative Example Ref.1 and Comparative Example Ref.2 will now be described.

Comparative Example Ref.1 has a cross-sectional structure shown at the lower portion of FIG. 12, the first portion 385-1 of the spacer is formed on the pixel defining layer 380, and the second portion 385-2 is not included. The pixel defining layer 380 is made of a black organic material, and the first portion 385-1 is made of a photosensitive polyimide (PSPI).

Comparative Example Ref.2 has a cross-sectional structure shown at the lower portion of FIG. 12, the first portion 385-1 of the spacer is formed on the pixel defining layer 380-1, and the pixel defining layer 380-1 and the first portion 385-1 of the spacer are made of a photosensitive polyimide (PSPI) to thus have a transparent characteristic.

The cross-sectional structures of SP1, SP2, SP3, and SP4 according to Comparative Examples are shown at the lower portion of FIG. 12. The SP1, SP2, SP3, and SP4 according to Comparative Examples form the second portion 385-2 of the spacer on the pixel defining layer 380, the pixel defining layer 380 is made of a black organic material, and the first portion 385-1 is made of a photosensitive polyimide (PSPI). Differences of the SP1, SP2, SP3, and SP4 according to Comparative Examples are distinguished according to the size of the width of the second portion 385-2 of the spacer. When going to Comparative Example of SP4 from Comparative Example of SP1, the width of the second portion 385-2 of the spacer is gradually reduced, and area ratios expressed in Table 1 are allowable.

TABLE 1

| | SP1 | SP2 | SP3 | SP4 |
|---|---|---|---|---|
| Ratio of spacer area vs. entire area | 80% | 70% | 57% | 50% |
| Ratio of spacer area vs. pixel defining layer | 93% | 83% | 67% | 58% |

Referring to a dotted line of FIG. 12, it is found that the scratch intensity is gradually reduced as going to Comparative Example of SP4 in which the width of the second portion 385-2 of the spacer is reduced. In an embodiment given with reference to FIG. 6 to FIG. 8, as the second portion 385-2 of the spacer is positioned inside the light blocking layer 220, the width of the second portion 385-2 of the spacer is relatively small, and as a result, the scratch intensity is also reduced.

However, more than a set or predetermined level of the scratch intensity is needed to be obtained so the width of the second portion 385-2 of the spacer may not be substantially reduced.

To have the scratch intensity corresponding to the Comparative Example of Ref.2 in FIG. 12, the structure that corresponds to the Comparative Example of SP1 and the Comparative Example of SP2 is needed, and when the horizontal gap g-1 between the spacer 385 that may have the average scratch intensity of the Comparative Example of Ref.2 with respect to the line marked as a dotted line of FIG. 12 and the edge of the pixel defining layer 380 is calculated, the calculated value of about 5.72 μm may be obtained.

Based on this point, when the horizontal gap g-1 between the second portion 385-2 of the spacer 385 and the edge of the pixel defining layer 380 is formed to be about 5.7 μm, the scratch intensity that corresponds to Comparative Example of Ref.2 is obtained so the problem according to the scratch intensity may not be generated. Here, the gap g-1 is changeable corresponding to the size of the pixel, and the gap g-1 may be about 3 μm to about 8 μm, depending on embodiments.

With reference to the Comparative Example of Ref.1 in FIG. 12, the scratch intensity is increased by having the second portion 385-2 of the spacer 385. Therefore, when attempting to reach the scratch intensity according to the Comparative Example of Ref.1, it may be sufficient to have the second portion 385-2 of the spacer 385.

Another embodiment including a separator will now be described with reference to FIG. 13 and FIG. 14.

Figure 13:
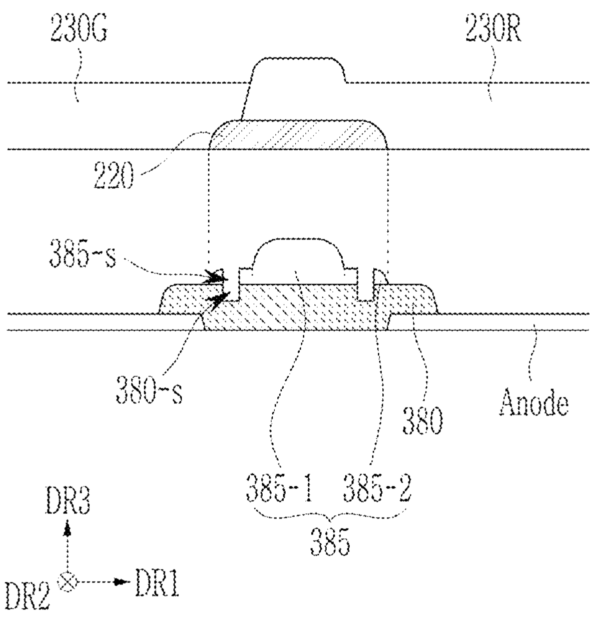
FIG. 13 and FIG. 14 show enlarged cross-sectional views of a portion of a display panel according to another embodiment.
Figure 14:
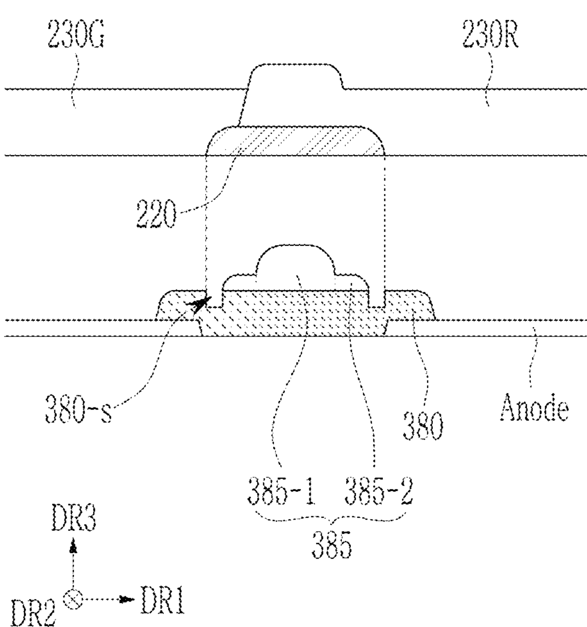

FIG. 13 and FIG. 14 show enlarged cross-sectional views of a portion of a display panel according to another embodiment.

When compared to an embodiment given with FIG. 8, the spacer 385 and/or the pixel defining layer 380 includes separators 385-*s* and 380-*s* with a concave groove structure in an embodiment described with reference to FIG. 13 and FIG. 14.

The separators 385-*s* and 380-*s* represents a portion on which the step is formed so that at least one of the functional layer FL or the cathode, positioned on the upper portions of the pixel defining layer 380 and the spacer 385 may be separated. Depending on embodiments, the separators 385-*s* and 380-*s* may be formed to separate the emission layer EML positioned in the opening OP of the adjacent pixel defining layer 380.

An embodiment of FIG. 13 will now be described.

As shown in FIG. 8, in an embodiment of FIG. 13, the spacer 385 is formed inside the light blocking layer 220, and the second portion 385-2 of the spacer 385 overlaps the entire light blocking layer 220 and is not positioned outside the light blocking layer 220.

In an embodiment of FIG. 13, separators 385-*s* and 380-*s* are additionally formed on one portion of the second portion 385-2 of the spacer 385 and the pixel defining layer 380 positioned therebelow. In detail, the separator 385-*s* is positioned on the second portion 385-2 of the spacer 385, and the separator 380-*s* is positioned on the pixel defining layer 380. The second portion 385-2 of the spacer 385 is penetrated by the separator 385-*s*, and the pixel defining layer 380 is not penetrated by the separator 380-*s*, but is formed to be a concave groove. However, depending on embodiments, the pixel defining layer 380 may be penetrated by the separator 380-*s*. For example, the groove structure of the separator 385-*s* of the spacer 385 forms the pixel defining layer 380 and the pixel defining layer 380 may include an additional separator 380-*s*.

The widths and depths of the separators 385-*s* and 380-*s* may have values for at least one of the functional layer FL, the emission layer EML, or the cathode to be stacked on the upper portion. The functional layer FL may be positioned above/below the emission layer EML, and may be distinguished into a first functional layer positioned at the lower portion of the emission layer EML and a second functional layer positioned at the upper portion thereof. The separators 385-*s* and 380-*s* may disconnect at least one of the first functional layer or the second functional layer.

Figure 25:
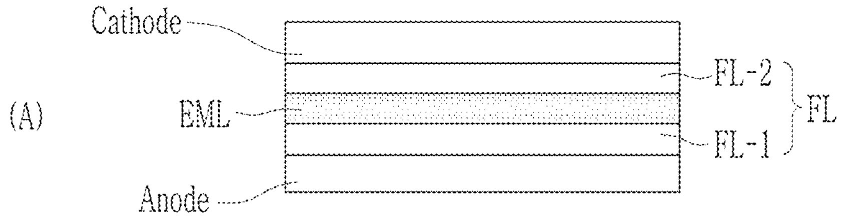
FIG. 25 shows a cross-sectional view of an emission layer according to an embodiment.
Figure 25:
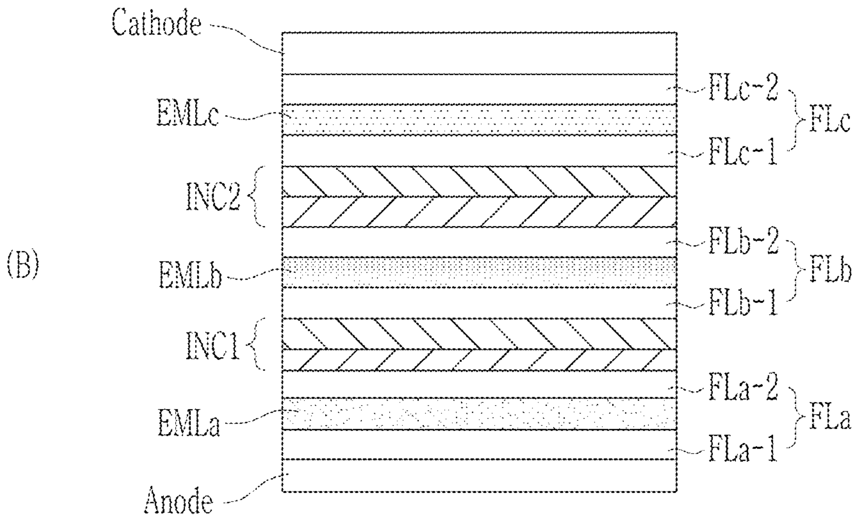

Referring to FIG. 25, the width and the depth of the separator 380-*s* may be changed depending on whether one or plural emission layers EML are positioned in the opening OP of the pixel defining layer 380.

FIG. 13 shows an embodiment in which the separator 380-*s* is positioned in the middle of the second portion 385-2 of the spacer 385, and the position of the separator 380-*s* from among the second portion 385-2 may be diverse depending on embodiments. The separator 380-*s* may have a linear or curved structure, and may be disposed along a portion of the first portion 385-1 of the spacer 385. The separator 380-*s* separates at least one of the functional layer FL, the emission layer EML, or the cathode, positioned in the opening OP of the adjacent pixel defining layer 380, and may be positioned between two openings OP of the pixel defining layer 380.

An embodiment of FIG. 14 will now be described.

Differing from FIG. 13, referring to FIG. 14, the separator 380-*s* is not positioned on the spacer 385, and the separator 380-*s* is positioned on the pixel defining layer 380. For example, the spacer 385 is positioned inside the separator 380-*s* in a plan view, and the separator 380-*s* does not overlap the spacer 385 in a plan view.

FIG. 14 shows that the separator 380-*s* is positioned on the portion overlapping the light blocking layer 220, and depending on embodiments, it may be positioned on the portion that does not overlap the light blocking layer 220.

The width and the depth of the separator 380-*s* of FIG. 14 may have values for at least one of the functional layer FL, the emission layer EML, or the cathode stacked on the upper portion to be separated. The separator 380-*s* may have a linear or curved structure, and may be disposed along a portion of the first portion 385-1 of the spacer 385. The separator 380-*s* may be positioned between two openings OP of the adjacent pixel defining layer 380.

A configuration in which an embodiment of FIG. 8 and an embodiment of FIG. 13 and FIG. 14 are disposed in a plan view will now be described with reference to FIG. 15 to FIG. 19.

FIG. 15 to FIG. 19 show top plan views of a portion of a display panel according to one or more suitable embodiments.

Figure 15:
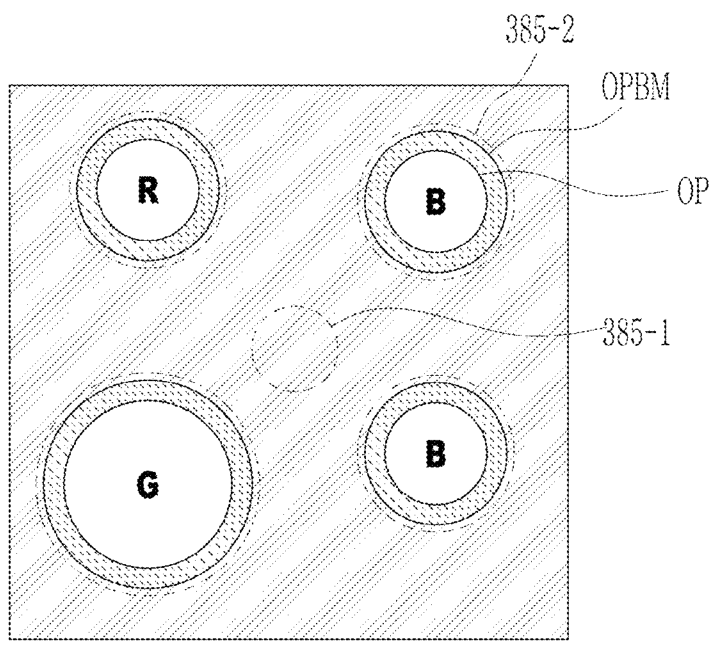
FIGS. 15-19 show top plan views of a portion of a display panel according to one or more suitable embodiments.
Figure 16:
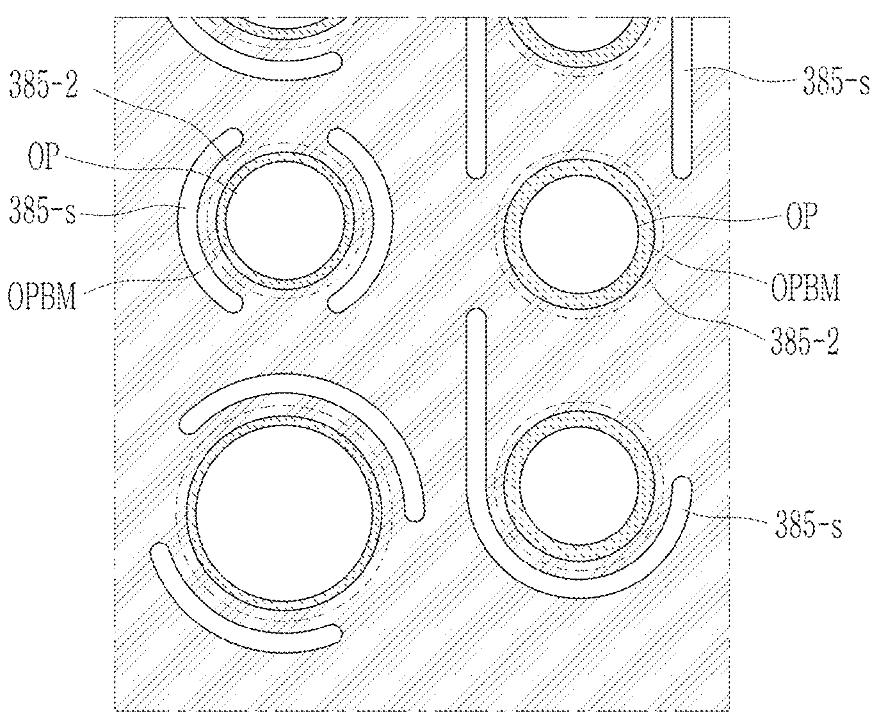

FIG. 15 and FIG. 16 exemplifies an embodiment in which the opening OP of the pixel defining layer 380 and the opening OPBM of the light blocking layer 220 are circular.

FIG. 15 shows a planar configuration in which one red (R) emission layer, two blue (B) emission layers, and one green (G) emission layer are disposed. An emission layer is positioned in the opening OP of the pixel defining layer 380, and the opening OPBM of the light blocking layer 220 is positioned outside the opening OP of the pixel defining layer 380. A boundary of the second portion 385-2 of the spacer 385 is disposed outside the opening OPBM of the light blocking layer 220, and the spacer 385 overlaps the light blocking layer 220 and is covered by the light blocking layer 220 in a plan view. The first portion 385-1 of the spacer 385 is positioned in centers of the openings OP of the four adjacent pixel defining layers 380. However, the position of the first portion 385-1 of the spacer 385 may be diverse depending on embodiments.

FIG. 16 shows a shape and a position of the separator 385-*s* in the configuration of the pixel defining layer 380, the spacer 385, and the light blocking layer 220 having the disposal shown in FIG. 15.

FIG. 16 illustrates an embodiment in which the separator 385-*s* is positioned on the second portion 385-2 of the spacer 385 and the pixel defining layer 380, as shown in FIG. 13. For example, the separator 385-*s* is positioned more outside than the boundary of the second portion 385-2 of the spacer 385 positioned outside the opening OPBM of the light blocking layer 220. Therefore, the separator 385-*s* overlaps the light blocking layer 220 in a plan view.

The separator 385-*s* shown in FIG. 16 includes a portion (also referred to as an opening corresponding portion) that corresponds to the shape of the opening OPBM of the light blocking layer 220 or the opening OP of the pixel defining layer 380 and is distant by a set or predetermined interval. The separator 385-*s* may further include an extension additionally extending from the opening corresponding portion.

The separator 385-*s* may be positioned in the centers of the two openings OP of the adjacent pixel defining layer 380 on which an adjacent emission layer of another color is positioned. However, when the emission layers with the same color are positioned in the two openings OP of the adjacent pixel defining layer 380, there is no need for the separator 380-*s* to be positioned in the centers of the two openings OP.

Depending on embodiments, in a like way of the embodiment given with reference to FIG. 14, the separator 380-*s* may be positioned between the opening OPBM of the light blocking layer 220 and the boundary of the second portion 385-2 of the spacer 385.

Figure 17:
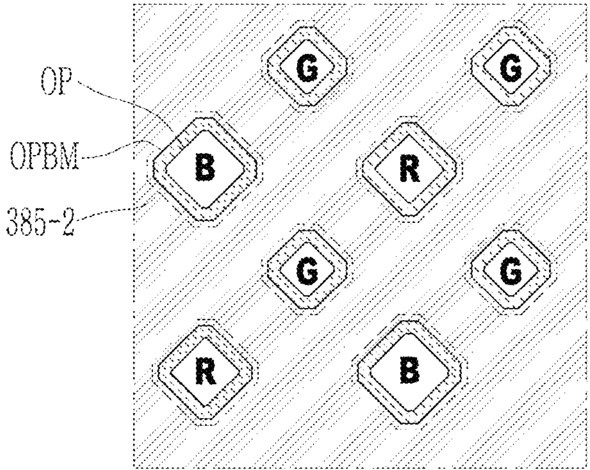

Depending on embodiments, as shown in FIG. 15 and FIG. 16, the opening OPBM of the light blocking layer 220 and the opening OP of the pixel defining layer 380 may not be circular, and FIG. 17 shows an embodiment in which they have a rhombus shape. In the embodiment in which the opening OPBM of the light blocking layer 220 and the opening OP of the pixel defining layer 380 have rhombus shapes, the boundary of the second portion 385-2 of the spacer 385 may also have the rhombus shape. Further, when the separator 380-*s* is formed, the opening corresponding portion in which the separator 380-*s* corresponds to the opening OPBM of the light blocking layer 220 or the opening OP of the pixel defining layer 380 and is distant therefrom at a set or predetermined distance may have the rhombus shape.

An embodiment in which the opening OPBM of the light blocking layer 220 and the opening OP of the pixel defining layer 380 have rectangular shapes will now be described with reference to FIG. 18 and FIG. 19.

Figure 18:
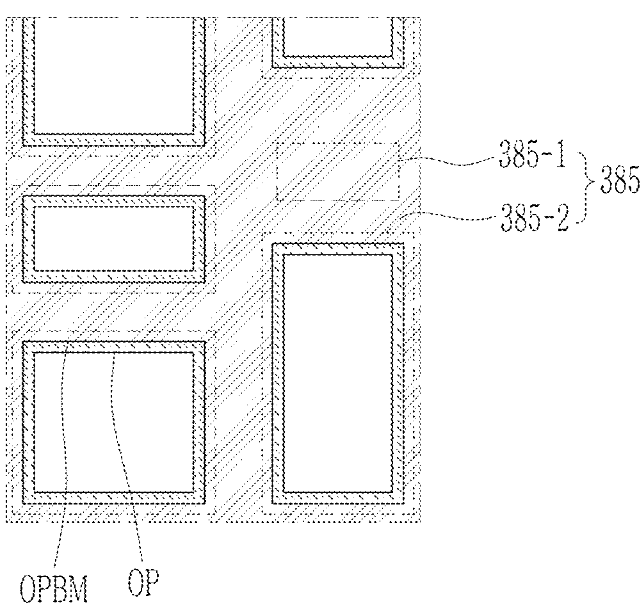

FIG. 18 shows a planar disposal of an embodiment including no separator 380-*s*.

Referring to FIG. 18, the quadrangular opening OPBM of the light blocking layer 220 is positioned outside the quadrangular opening OP of the pixel defining layer 380. The boundary of the second portion 385-2 of the spacer 385 is disposed outside the opening OPBM of the light blocking layer 220, and the boundary of the second portion 385-2 of the spacer 385 has the quadrangular opening. Regarding the second portion 385-2 of the spacer 385 in a plan view, the spacer 385 overlaps the light blocking layer 220 and is covered by the light blocking layer 220, and the first portion 385-1 of the spacer 385 is positioned outside the openings OP of the two pixel defining layers 380 provided near each other in one direction. However, the position of the first portion 385-1 of the spacer 385 may be diverse depending on embodiments.

Figure 19:
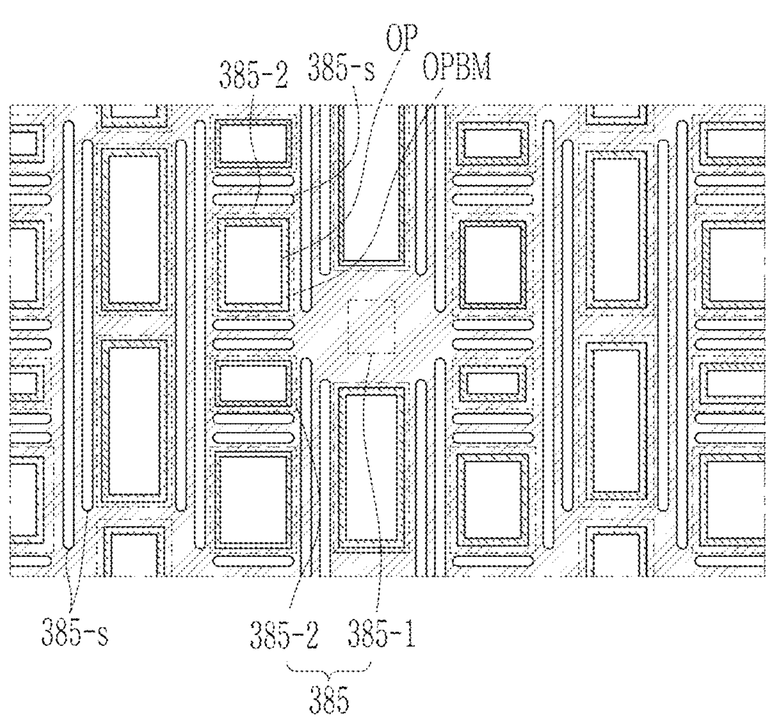

FIG. 19 shows the shape and the position of the separator 385-*s* in the configuration of the pixel defining layer 380, the spacer 385, and the light blocking layer 220 having the disposal of FIG. 18.

FIG. 19 illustrates an embodiment in which the separator 385-*s* is positioned on the second portion 385-2 of the spacer 385 and the pixel defining layer 380, as shown in FIG. 13. For example, the separator 385-*s* is positioned more outside than the boundary of the second portion 385-2 of the spacer 385 positioned outside the opening OPBM of the light blocking layer 220. Therefore, the separator 385-*s* overlaps the light blocking layer 220 in a plan view. In an embodiment given with FIG. 19, one pair of separators 385-*s* are disposed between the openings OPBM of the two adjacent light blocking layers 220 or the two openings OP of the pixel defining layer 380. When the one pair of separators 385-*s* are utilized, at least one of the functional layer FL, the emission layer EML, or the cathode, may be clearly disconnected more easily, thereby removing the drawback of not disconnecting because of processing errors.

The separator 385-*s* shown in FIG. 19 includes a portion (also referred to as an opening corresponding portion) that corresponds to the shape of the opening OPBM of the light blocking layer 220 or the opening OP of the pixel defining layer 380 and is distant by a set or predetermined interval, and as the openings OP and OPBM have quadrangular shapes, the separator 385-*s* is formed to be linear along one side of the quadrangular shape. However, depending on embodiments, the separator 385-*s* may be bent along the quadrangular shapes of the openings OP and OPBM.

The separator 385-*s* may be positioned in the centers of the two openings OP of the adjacent pixel defining layer 380 on which the adjacent emission layer with a different color is positioned. However, when the emission layer with the same color is positioned in the two openings OP of the adjacent pixel defining layer 380, the separator 385-*s* may not be positioned in the centers of the two openings OP.

The embodiment in which the opening OP of the pixel defining layer 380 and light the opening OPBM of the light blocking layer 220 have the same shape has been described, and the two openings OP and OPBM may have different shapes.

The configuration of the spacer 385 positioned in the display area DA or the first component area EA1 has been described. A configuration of a U385 (also referred to as a component spacer) positioned in a second component area EA2 will now be described with reference to FIG. 20 to FIG. 22.

The second component area EA2 will now be described with reference to FIG. 20.

Figure 20:
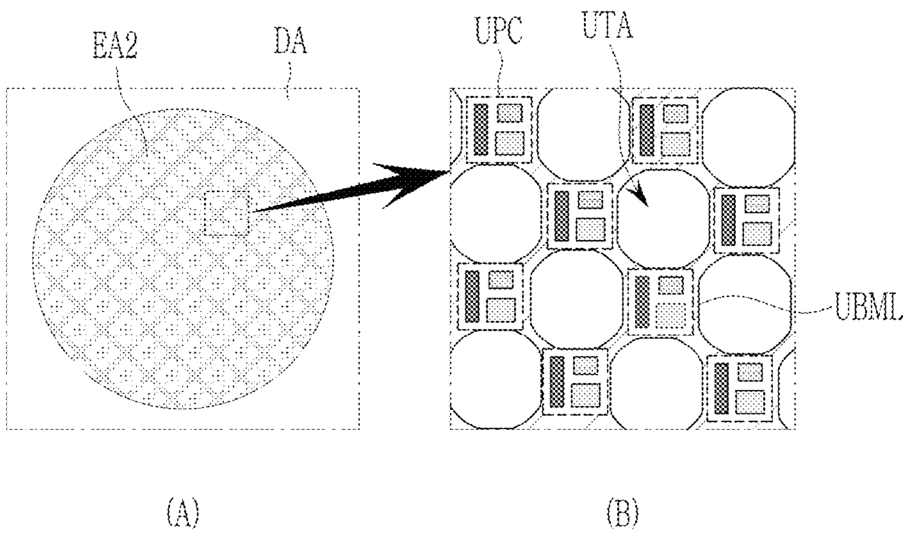
FIG. 20 shows a structure of a second component area according to an embodiment.

FIG. 20 shows a structure of a second component area according to an embodiment.

FIG. 20(A) shows an enlarged second component area EA2, and FIG. 20 (B) enlarges part of the second component area EA2 and shows configurations of the unit pixel UPC and the light transmitting area UTA.

Referring to FIG. 20(A), the second component area EA2 is surrounded by the display area DA, and it may have a circular shape or a shape in proportion to the same in a plan view. For example, as shown in FIG. 20(A), when the boundary of the display area DA and the second component area EA2 is magnified, it corresponds to a circle, and when the boundary is further magnified, the boundary of the normal pixel and the second component pixel is formed to not be a curved line but a short bent straight line so it may have a shape that is not a circle but is in proportion to the same. A shape of the second component area EA2 in a plan view may be diverse depending on embodiments so it is not limited thereto.

FIG. 20(B) shows a planar shape of a unit pixel UPC and a light transmitting area UTA formed in the second component area EA2 according to an embodiment.

The unit pixel UPC is disposed on respective positions of apexes of the rhombus at regular gaps. A light blocking portion UBML is positioned on the lower portion of the unit pixel UPC. The light blocking portion UBML includes a plurality of extensions formed to be wide and a connector for connecting the extensions in a diagonal direction, and there are opening regions partitioned by the extensions and the connectors. The opening region of the light blocking portion UBML corresponds to the light transmitting area UTA, and one unit pixel UPC is disposed on the extension of the light blocking portion UBML.

One unit pixel UPC includes one red second component pixel, one blue second component pixel, and one green second component pixel. FIG. 20(B) does not show pixel circuits of respective second component pixels, and shows light emitting diodes R, G, and B of respective colors. One blue light emitting diode B is lengthily disposed on one side, and the red light emitting diode R and the green light emitting diode G are disposed near the blue light emitting diode B. The number and the disposal of the pixels included in one unit pixel UPC may be different from what is described with reference to FIG. 20(B).

The number of pixels per area of the second component area EA2 may be less than the number of pixels per area of the normal pixels of the display area DA. Hence, resolution of the display area DA may be formed to be high, and the resolution of the second component area EA2 may be formed to be relatively low.

Configurations of a pixel circuit of the second component area EA2, an anode, and a spacer U385 positioned thereon will now be described with reference to FIG. 21 to FIG. 22.

Figure 21:
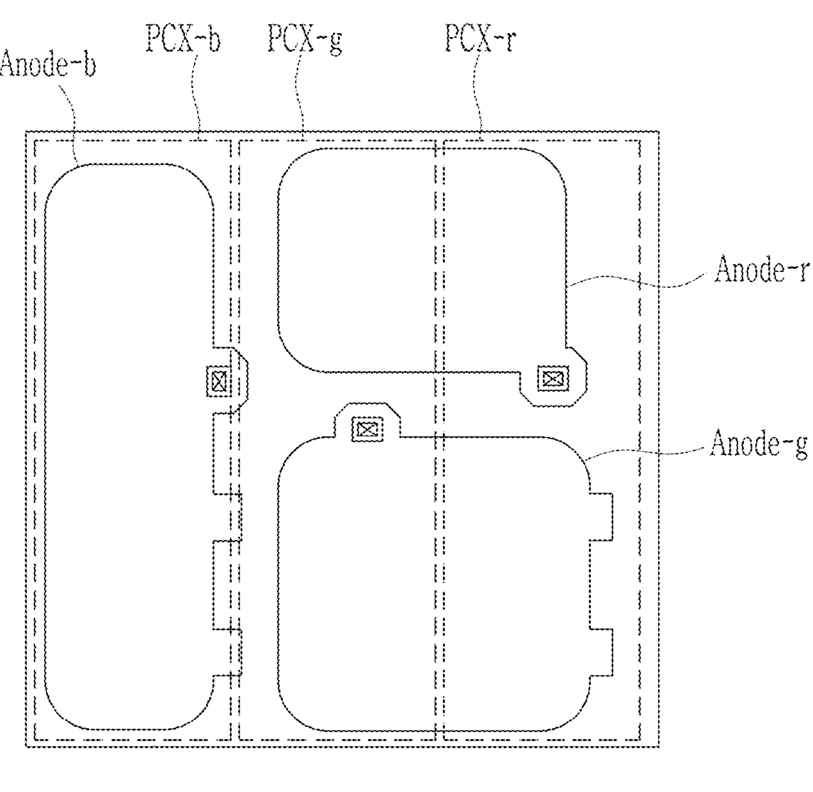
FIG. 21 shows a top plan view of a structure of a pixel circuit and an anode in a second component area.
Figure 22:
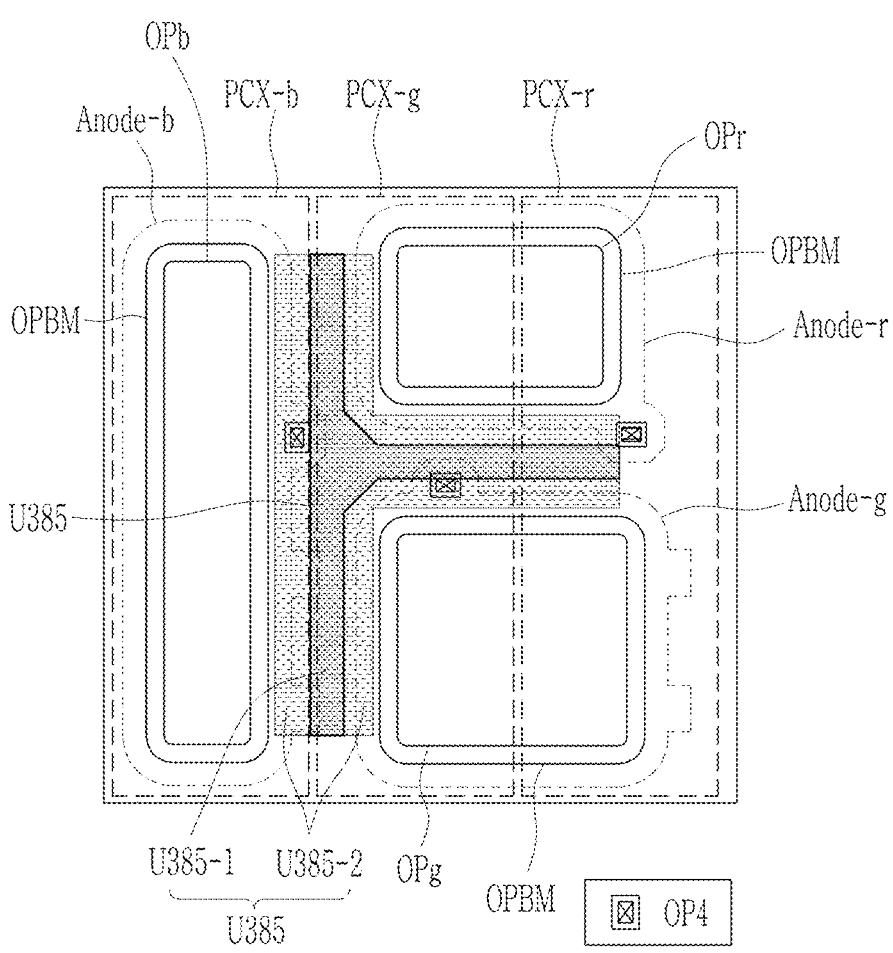
FIG. 22 shows a top plan view of a structure of a spacer in a second component area.

FIG. 21 shows a top plan view of a structure of a pixel circuit and an anode in a second component area, and FIG. 22 shows a top plan view of a structure of a spacer in a second component area.

FIG. 21 shows configurations of pixel circuits PCX-r, PCX-g, and PCX-b and anodes Anode-r, Anode-g, and Anode-b, and the pixel circuits PCX-r, PCX-g, and PCX-b show no detailed configurations but show the regions in which the pixel circuits PCX-r, PCX-g, and PCX-b are positioned as quadrangles. The circuit configurations and actual stacking patterns of the pixel circuits PCX-r, PCX-g, and PCX-b may be diverse, and a circuit configuration according to an embodiment will be described with reference to FIG. 26.

One of terminals of the pixel circuits PCX-r, PCX-g, and PCX-b transmit output currents to the light emitting diode, and the one terminals of the pixel circuits PCX-r, PCX-g, and PCX-b are exposed through openings OP4. The anodes Anode-r, Anode-g, and Anode-b are formed thereon and the respective openings OP4 are electrically connected to the pixel circuits PCX-r, PCX-g, and PCX-b and receive the output currents.

FIG. 21 shows that the blue anode Anode-b is positioned on the blue pixel circuit PCX-b, and regarding other colors, the anodes of other colors overlap the pixel circuit of other colors. For example, the red anode Anode-r overlaps the red and green pixel circuits PCX-r and PCX-g, and the green anode Anode-g overlaps the red and green pixel circuits PCX-r and PCX-g.

Referring to FIG. 21, the first one of the three light emitting diodes included in the unit pixel UPC is lengthily disposed on the left (e.g., the first one of the three light emitting diodes is left of the second and third ones of the three light emitting diodes in a length direction of the unit pixel UPC), and the second light emitting diode and the third light emitting diode are disposed top to bottom in a right column (e.g., the second light emitting diode is above the third light emitting diode and the second and third light emitting diodes are right of the first light emitting diode in the length direction of the unit pixel UPC). Therefore, the anode Anode-b from among the anodes Anode-r, Anode-g, and Anode-b are lengthily disposed on the left, and the anodes Anode-r and Anode-g are disposed top to bottom in the right column. The disposal of the anodes Anode-r, Anode-g, and Anode-b may be diverse depending on embodiments.

Configurations of the openings OPr, OPg, and OPb of the pixel defining layer 380 positioned on the anodes Anode-r, Anode-g, and Anode-b and the spacer U385 positioned on the pixel defining layer 380 will now be described with reference to FIG. 22.

Each spacer U385 formed in the second component area EA2 is disposed for each unit pixel UPC.

In detail, openings OPr, OPg, and OPb of the pixel defining layer 380 for exposing at least part of the anodes Anode-r, Anode-g, and Anode-b are positioned, and the spacer U385 is formed on the pixel defining layer 380. The spacer U385 includes a first portion U385-1 that is high (also referred to as a first component spacer) and a second portion U385-2 (also referred to as a second component spacer) that is lower than the first portion U385-1 and is positioned around the first portion U385-1. The first portion U385-1 and the second portion U385-2 may be integrally formed to each other, and the first portion U385-1 has a T shape, and the second portion U385-2 may be positioned around the first portion U385-1. Here, the spacer U385 and the first portion U385-1 may have a T shape that is rotated by 90 degrees in the counterclockwise direction with reference to FIG. 22.

In an embodiment given with FIG. 22, an end of the first portion U385-1 is not positioned on the second portion U385-2, and the ends of the first portion U385-1 and the second portion U385-2 correspond to each other. The spacer U385 does not protrude outside the unit pixel PXC but is positioned inside the same. The first portion U385-1 and the second portion U385-2 may be made of a positive-type or kind transparent organic material, for example, a photosensitive polyimide (PSPI). A height of the first portion U385-1 may be about 1.5 μm, and it may be about 1.1 μm to about 2.0 μm depending on embodiments. A height of the second portion U385-2 may be about 0.4 μm, and it may be about 0.1 μm to about 0.5 μm.

In some embodiments, each spacer U385 having a T shape rotated by 90 degrees in the counterclockwise direction is formed on one unit pixel UPC. Referring to FIG. 22, the T shapes are connected to each other to be integrally formed, and depending on embodiments, they may be formed to be divided into a plurality of portions.

The opening OPBM of the light blocking layer 220 is formed to be wide in a plan view, compared to the openings OPr, OPg, and OPb of the pixel defining layer 380. The spacer U385 does not overlap the opening OPBM of the light blocking layer 220 in a plan view, it overlaps the light blocking layer 220, and the boundary of the second portion U385-2 is disposed to overlap the light blocking layer 220. As a result, when seen from the above, the spacer U385 is disposed to be covered with the light blocking layer 220 and be invisible. The pixel defining layer 380 includes a plurality of openings OP, and the light blocking layer 220 includes a plurality of openings OPBM overlapping the opening OP of the pixel defining layer 380. The component spacer U385 is positioned on the pixel defining layer 380, and the entire component spacer U385 may overlap the light blocking layer 220 in a plan view.

Depending on embodiments, a separator may be further included in FIG. 22 in a like way of the embodiment given with FIG. 13 and FIG. 14. The separator may overlap the light blocking layer 220 in a plan view and may be unseen from above.

A cross-sectional structure of the light emitting display device will now be described with reference to FIG. 23 and FIG. 24, and the configuration of FIG. 23 will be first described.

Figure 23:
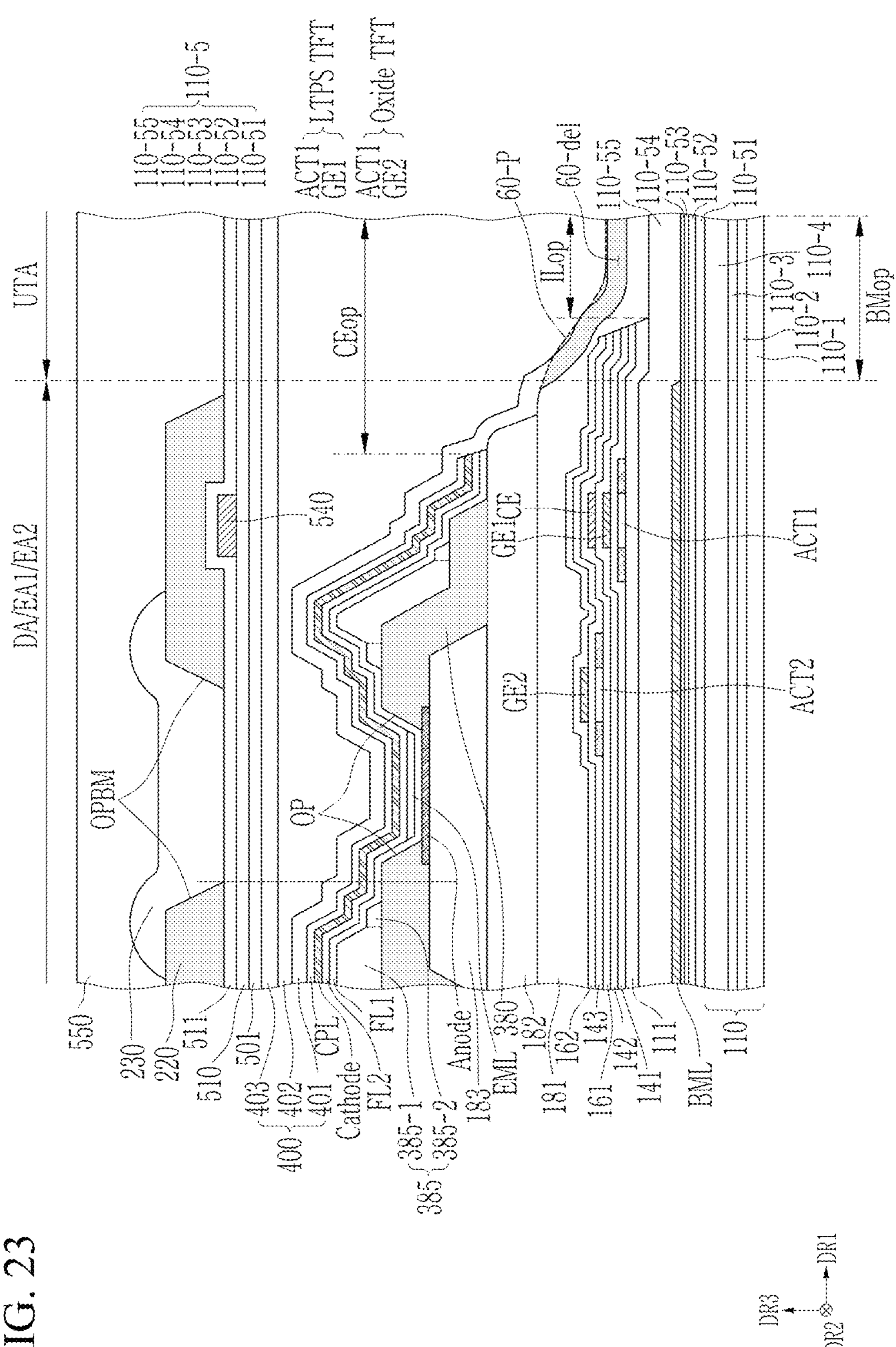
FIG. 23 shows a cross-sectional view of a light emitting display device according to an embodiment.

FIG. 23 shows a cross-sectional view of a light emitting display device according to an embodiment.

FIG. 23 shows a cross-sectional structure of the light transmitting area UTA and a cross-sectional structure of the pixel, and the pixel may correspond to the normal pixel of the display area DA, and component pixels of the first and second component areas EA1 and EA2. The configuration of the normal pixel will now be generally described.

The light emitting display device may be classified into a lower panel layer and an upper panel layer, and the light emitting diode and the pixel circuit configuring the pixel may be positioned on the lower panel layer, and an encapsulation layer 400 for covering the same may also be included. The pixel circuit may include a second organic layer 182 and a third organic layer 183 and may signify the configuration of the lower portion, and the light emitting diode may represent the upper portion of the third organic layer 183 and may signify the configuration positioned at the lower portion of the encapsulation layer 400. The configuration positioned on the upper portion of the encapsulation layer 400 may correspond to the upper panel layer. Depending on embodiments, the third organic layer 183 may not be included.

Referring to FIG. 23, the substrate 110 may include first to fourth sub-substrate layers 110-1, 110-2, 110-3, and 110-4.

The first sub-substrate layer 110-1 and the fourth sub-substrate layer 110-4 may include at least one of a polyimide-based resin, an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, or a perylene-based resin. For example, the first and fourth sub-substrate layers 110-1 and 110-4 may respectively include a polyimide.

The second sub-substrate layer 110-2 and the third sub-substrate layer 110-3 may respectively include an inorganic material. For example, the second sub-substrate layer 110-2 and the third sub-substrate layer 110-3 may respectively include at least one of a silicon oxide, a silicon nitride, a silicon oxynitride, or an amorphous silicon. For example, the second sub-substrate layer 110-2 may include a silicon oxynitride, and the third sub-substrate layer 110-3 may include a silicon oxide.

A thickness of the first sub-substrate layer 110-1 may be greater than a thickness of the fourth sub-substrate layer 110-4. For example, the thickness of the first sub-substrate layer 110-1 may be 100,000 angstroms, and the thickness of the fourth sub-substrate layer 110-4 may be 56,000 angstroms. The thickness of the second sub-substrate layer 110-2 may be less than the thickness of the third sub-substrate layer 110-3. For example, the thickness of the second sub-substrate layer 110-2 may be 1,000 angstroms, and the thickness of the third sub-substrate layer 110-3 may be 5,000 angstroms. However, the thicknesses of the first to fourth sub-substrate layers 110-1, 110-2, 110-3, and 110-4 are not limited to the above-noted numerical values.

The barrier layer 110-5 may be disposed on the substrate 110. The barrier layer 110-5 may include a plurality of sub-barrier layers 110-51, 110-52, 110-53, 110-54, and 110-55, and a metal layer BML.

The sub-barrier layers 110-51, 110-52, 110-53, 110-54, and 110-55 may include a first sub-barrier layer 110-51, a second sub-barrier layer 110-52, a third sub-barrier layer 110-53, a fourth sub-barrier layer 110-54, and a fifth sub-barrier layer 110-55 sequentially stacked in a direction leaving the substrate 110. The first to fifth sub-barrier layers 110-51, 110-52, 110-53, 110-54, and 110-55 may respectively include an inorganic material. For example, the first to fifth sub-barrier layers 110-51, 110-52, 110-53, 110-54, and 110-55 may respectively include at least one of a silicon oxide, a silicon nitride, a silicon oxynitride, or an amorphous silicon. For example, the first sub-barrier layer 110-51 may include a silicon oxynitride, the second sub-barrier layer 110-52 may include a silicon oxide, the third sub-barrier layer 110-53 may include amorphous silicon, the fourth sub-barrier layer 110-54 may include a silicon oxide, and the fifth sub-barrier layer 110-55 may include a silicon oxide.

The fifth sub-barrier layer 110-55 from among the first to fifth sub-barrier layers 110-51, 110-52, 110-53, 110-54, and 110-55 is the nearest to the transistor. The fifth sub-barrier layer 110-55 may be referred to as an upper portion sub-barrier layer. The thickness of the fifth sub-barrier layer 110-55 may be greater than the respective thicknesses of the first to fourth sub-barrier layers 110-51, 110-52, 110-53, and 110-54. For example, the thickness of the fifth sub-barrier layer 110-55 may be greater than the sum of the thicknesses of the first to fourth sub-barrier layers 110-51, 110-52, 110-53, and 110-54. For example, the first sub-barrier layer 110-51 may be about 1,000 angstroms thick, the second sub-barrier layer 110-52 may be about 1,500 angstroms thick, the third sub-barrier layer 110-53 may be about 100 angstroms thick, the fourth sub-barrier layer 110-54 may be about 130 angstroms thick, and the fifth sub-barrier layer 110-55 may be about 4,200 angstroms thick. For example, the thickness of the fifth sub-barrier layer 110-55 may be greater than the above-described thickness.

A constant voltage at a set or predetermined voltage level may be applied to the metal layer BML, for example, a driving voltage ELVDD may be provided.

The metal layer BML may be disposed between the fourth sub-barrier layer 110-54 and the fifth sub-barrier layer 110-55. The metal layer BML may be covered by the fifth sub-barrier layer 110-55. The fifth sub-barrier layer 110-55 has the greatest thickness from among the first to fifth sub-barrier layers 110-51, 110-52, 110-53, 110-54, and 110-55 so changing degrees of characteristics of transistors by the voltages provided to the metal layer BML may be reduced.

The metal layer BML may have an opening BMop for defining the light transmitting area UTA. The metal layer BML may be a pattern functioning as a mask when an opening CEop is formed in the cathode. For example, the light irradiated toward the cathode from a rear side of the substrate 110 may pass through the opening BMop of the metal layer BML and may reach respective portions of the cathode and the capping layer CPL. For example, part of the cathode and the capping layer CPL may be removed by the light having passed through the opening BMop of the metal layer BML. The light may be laser beams.

A region overlapping the opening BMop of the metal layer BML may be defined to be a light transmitting area UTA, and the other region may be defined to be a region that is not the light transmitting area UTA, that is, a display area DA or an element area EA. The metal layer BML may include titanium, silver, and an alloy containing silver, molybdenum, an alloy containing molybdenum, aluminum, an alloy containing aluminum, an aluminum nitride, tungsten, a tungsten nitride, copper, an indium tin oxide, or an indium zinc oxide, and it is not specifically limited thereto.

The buffer layer 111 may be disposed on the barrier layer 110-5. The buffer layer 111 may be provided to the display area DA, the element area EA, and the light transmitting area UTA. The buffer layer 111 may prevent or reduce metal atoms or impurities from being spread to the first semiconductor pattern ACT1 from the substrate 110. Further, the buffer layer 111 may adjust a heat providing rate for a crystallization process for forming the first semiconductor pattern ACT1 so that the first semiconductor pattern ACT1 may be uniformly formed.

The buffer layer 111 may include a plurality of inorganic layers. For example, the buffer layer 111 may include a first sub-buffer layer including a silicon nitride, and a second sub-buffer layer disposed on the first sub-buffer layer and including a silicon oxide. The buffer layer 111 may not overlap the light transmitting area UTA. For example, an opening ILop that corresponds to the light transmitting area UTA may be defined in the buffer layer 111. As the buffer layer 111 is not provided to the light transmitting area UTA, transmittance of the light transmitting area UTA may be further increased.

The pixel circuit including transistors may be disposed on the buffer layer 111, and the light emitting diode may be disposed on the pixel circuit.

A silicon thin film transistor LTPS TFT and an oxide thin film transistor OXIDE TFT of the pixel circuit part are exemplarily shown in the drawing.

The first semiconductor pattern ACT1 may be disposed on the buffer layer 111. The first semiconductor pattern ACT1 may include a silicon semiconductor. For example, the silicon semiconductor may include amorphous silicon and polycrystalline silicon. For example, the first semiconductor pattern ACT1 may include low temperature polysilicon.

A portion of the first semiconductor pattern ACT1 disposed on the buffer layer 111 is shown, and the first semiconductor pattern ACT1 may be further disposed in another region. The first semiconductor pattern ACT1 may be arranged on the pixels with a specific rule. Electrical properties of the first semiconductor pattern ACT1 are changeable according to its doping state. The first semiconductor pattern ACT1 may include a first region with high conductivity and a second region with low conductivity. The first region may be doped with an n-type or kind dopant or a p-type or kind dopant. A p-type or kind transistor may include a doping region doped with the p-type or kind dopant, and an n-type or kind transistor may include a doping region doped with the n-type or kind dopant. The second region may be an undoped region or may be a region doped with a lower concentration than the first region.

The conductivity of the first region may be greater than the conductivity of the second region, and the first region may substantially function as an electrode or a signal line. The second region may substantially correspond to an active region (or a channel) of the transistor. In other words, a portion of the semiconductor pattern may be the active region of the transistor, another portion thereof may be a source or a drain of the transistor, and the other portion thereof may be a connection electrode or a connection signal line.

The source region, the active region, and the drain region of the silicon thin film transistor LTPS TFT may be formed of the first semiconductor pattern ACT1. The source region and the drain region may extend in opposite directions from the active region in a cross-sectional view.

The pixel circuit may include a plurality of inorganic layers and organic layers. In an embodiment, insulating layers 141, 142, 143, 161, and 162 stacked on the buffer layer 111 may be inorganic layers, and insulating layers 181, 182, and 183 may be organic layers.

The first gate insulating layer 141 may be disposed on the buffer layer 111. The first gate insulating layer 141 may cover the first semiconductor pattern ACT1. The first gate insulating layer 141 may be an inorganic layer and/or an organic layer, and may have a single-layered or multi-layered structure. The first gate insulating layer 141 may include at least one of an aluminum oxide, a titanium oxide, a silicon oxide, a silicon nitride, a silicon oxynitride, a zirconium oxide, or a hafnium oxide. In the present embodiment, the first gate insulating layer 141 may be a single-layered silicon oxide layer. The insulating layer to be described in addition to the first gate insulating layer 141 may have a single-layered or multi-layered structure.

A gate electrode GE1 of the silicon thin film transistor LTPS TFT or LTPS TFTa is disposed on the first gate insulating layer 141. The gate electrode GE1 may be part of the metal pattern. The gate electrode GE1 overlaps the active region. The gate electrode GE1 may function as a mask for a process for doping the first semiconductor pattern. The gate electrode GE1 may include titanium, silver, and an alloy containing silver, molybdenum, an alloy containing molybdenum, aluminum, an alloy containing aluminum, an aluminum nitride, tungsten, a tungsten nitride, copper, an indium tin oxide, or an indium zinc oxide, and it is not specifically limited thereto.

The second gate insulating layer 142 is disposed on the first gate insulating layer 141, and may cover the gate electrode GE1. The second gate insulating layer 142 may be an inorganic layer, and may have a single-layered or multi-layered structure. The second gate insulating layer 142 may include at least one of a silicon oxide, a silicon nitride, or a silicon oxynitride. In the present embodiment, the second gate insulating layer 142 may have a single layered structure including a silicon nitride layer.

The first interlayer insulating layer 161 may be disposed on the second gate insulating layer 142. The first interlayer insulating layer 161 may be an inorganic layer, and may have a single-layered or multi-layered structure. For example, the first interlayer insulating layer 161 may have a multi-layered structure including a silicon oxide layer and a silicon nitride layer. An electrode (CE) of the capacitor may be disposed between the second gate insulating layer 142 and the first interlayer insulating layer 161. Another electrode of the capacitor may be disposed between the first gate insulating layer 141 and the second gate insulating layer 142.

The second semiconductor pattern ACT2 may be disposed on the first interlayer insulating layer 161. The second semiconductor pattern ACT2 may include an oxide semiconductor. The oxide semiconductor may include a plurality of regions distinguishable according to whether a metal oxide is reduced. The region (hereinafter, a reduced region) in which the metal oxide is reduced has greater conductivity than the region (hereinafter, a non-reduced region) in which the metal oxide is not reduced. The reduced region substantially functions as the source/drain of the transistor or the signal line. The non-reduced region substantially corresponds to the active region (or the semiconductor region, the channel) of the transistor. In other words, a portion of the second semiconductor pattern ACT2 may be the active region of the transistor, another portion thereof may be the source/drain region of the transistor, and the other portion thereof may be a signal transmitting region.

The source region, the active region, and the drain region of the oxide thin film transistor OXIDE TFT may be formed from the second semiconductor pattern ACT2. The source region and the drain region may extend in the opposite directions from the active region in a cross-sectional view.

The oxide thin film transistor OXIDE TFT may overlap the metal layer BML. Therefore, the light input from the lower portion of the display panel DP may be blocked by the metal layer BML, and may not be provided to the active region of the oxide thin film transistor OXIDE TFT, and may shield an electrostatic potential voltage according to a polarization of the lower substrate.

Depending on positions, the oxide thin film transistor OXIDE TFT may not overlap the metal layer BML, and a layer for blocking and shielding the lower portion of the oxide thin film transistor OXIDE TFT may be added.

The third gate insulating layer 143 may be disposed on the first interlayer insulating layer 161. The third gate insulating layer 143 may cover the second semiconductor pattern ACT2. The third gate insulating layer 143 may be an inorganic layer, and may have a single-layered or multi-layered structure. The third gate insulating layer 143 may include at least one of an aluminum oxide, a titanium oxide, a silicon oxide, a silicon nitride, a silicon oxynitride, a zirconium oxide, or a hafnium oxide. In the present embodiment, the third gate insulating layer 143 may have a single-layered structure including a silicon oxide.

The gate electrode GE2 of the oxide thin film transistor OXIDE TFT is disposed on the third gate insulating layer 143. The gate electrode GE2 may be part of the metal pattern. The gate electrode GE2 overlaps the active region. For the process for doping the second semiconductor pattern ACT2, the gate electrode GE2 may function as a mask.

The second interlayer insulating layer 162 may be disposed on the third gate insulating layer 143, and may cover the gate electrode GE2. The second interlayer insulating layer 162 may be an inorganic layer and/or an organic layer, and may have a single-layered or multi-layered structure. For example, the second interlayer insulating layer 162 may have a multi-layered structure including a silicon oxide layer and a silicon nitride layer.

An opening ILop may be defined in the buffer layer 111 included in the pixel circuit and at least some of the insulating layers 141, 142, 143, 161, 162, 181, 182, and 183. For example, as the opening ILop is defined in the buffer layer 111 and the insulating layers 141, 142, 143, 161, and 162, and portions of the buffer layers 111 and the insulating layers 141, 142, 143, 161, and 162 overlapping the light transmitting area UTA are removed, transmittance of the light transmitting area UTA may be increased.

Side walls of the buffer layer 111 and the insulating layers 141, 142, 143, 161, and 162 may protrude further than a side wall of the metal layer BML.

The first organic layer 181 may be disposed on the second interlayer insulating layer 162. The first organic layer 181 may include an organic material, and the first organic layer 181 may include a polyimide-based resin. For example, the first organic layer 181 may include a photosensitive polyimide.

The first organic layer 181 may be disposed in the display area DA, the element area EA, and the light transmitting area UTA. Therefore, the first organic layer 181 may be referred to as a common organic layer. The first organic layer 181 may fill the opening ILop positioned in the buffer layer 111 and the insulating layers 141, 142, 143, 161, and 162. For example, the first organic layer 181 may overlap the light transmitting area UTA. As the first organic layer 181 is provided to the light transmitting area UTA, a step on the upper side of the first organic layer 181 may be reduced. When the steps of the layers overlapping the light transmitting area UTA are reduced, diffraction of the light input to the light transmitting area UTA may be eased (or reduced). Therefore, transformation of images caused by diffraction is reduced so quality of the image captured from a camera positioned on the rear side may be improved.

A portion of a preparatory common organic layer 60-*p*, in the thickness direction, disposed in the light transmitting area UTA is removed so the first organic layer 181 may be formed (or provided). FIG. 34 shows the preparatory common organic layer 60-*p* with a dotted line, and a removed portion 60-del is marked with dark hatching. To form the first organic layer 181 from the preparatory common organic layer 60-*p*, a halftone mask may be utilized.

The thickness of the first organic layer 181 in the light transmitting area UTA may be less than the thickness of the first organic layer 181 in the display area DA and the element area EA. For example, the thickness of the light transmitting area UTA may be a minimum thickness or an average thickness of the first organic layer 181, and the thickness in the display area DA and the element area EA may be a maximum thickness or an average thickness of the first organic layer 181. The thickness of the light transmitting area UTA may be equal to or greater than about 40% and less than about 100% of the thickness in the display area DA and the element area EA. As a thickness difference of the first organic layer 181 according to the region increases, the step of the upper side of the first organic layer 181 may be increased. In this case, for a process for patterning a conductive layer that is the nearest the light transmitting area UTA, the conductive layer may be further patterned (or removed) than is designed. For example, a probability for a line (or a wire) to be thinner increases, and a probability for defects to be generated may also be increased. As described in an embodiment, when more than about 40% of the thickness difference is provided, the probability for the defects to be generated may be reduced. Therefore, by providing more than about 40%) of the thickness difference according to the region, transmittance of the light transmitting area UTA may be increased and following side effects may be minimized or reduced.

For example, when the thickness in the display area DA and the element area EA is about 15,000 angstroms, the thickness of the light transmitting area UTA may be about 6,000 angstroms to about 10,000 angstroms. When the thickness of the light transmitting area UTA is greater than about 10,000 angstroms, a transmittance increasing effect may be deteriorated. Hence, the thickness of the light transmitting area UTA may be determined to be within a range of equal to or greater than about 40% of the thickness in the display area DA and the element area EA, and equal to or less than about 10,000 angstroms.

The second organic layer 182 may be disposed on the first organic layer 181, and the third organic layer 183 may be disposed on the second organic layer 182.

The respective first organic layer 181, the second organic layer 182, and the third organic layer 183 may include a general-purpose polymer, a polymer derivative having a phenol group, an acryl-based polymer, an imide-based polymer, an aryl ether-based polymer, an amide-based polymer, a fluorine-based polymer, a p-xylene-based polymer, a vinyl alcohol-based polymer, a blend thereof such as benzocyclobutene (BCB), polyimide, hexamethyldisiloxane (HMDSO), poly(methyl methacrylate) (PMMA), or polystyrene (PS).

The light emitting diode may be disposed on the pixel circuit. Each light emitting diode may include an anode, a first functional layer FL1, an emission layer EML, a second functional layer FL2, and a cathode. The first functional layer FL1, the second functional layer FL2, and the cathode may be provided to the display area DA and the element area EA except the light transmitting area UTA.

The anode may be disposed on the third organic layer 183. The anode may be connected to one electrode of the pixel circuit through an opening penetrating the second organic layer 182 and the third organic layer 183. The anode may be a (semi) transmitting electrode or a reflecting electrode. According to an embodiment, the anode may include a reflecting layer made of silver, magnesium, aluminum, platinum, palladium, gold, nickel, neodymium, iridium, chromium, or their compound, and a transparent or semi-transparent electrode layer formed on the reflecting layer. A transparent or semi-transparent electrode layer may include at least one of an indium tin oxide, an indium zinc oxide, an indium gallium zinc oxide, a zinc oxide, an indium oxide, or an aluminum doped zinc oxide. For example, the anode may include a multi-layered structure in which an indium tin oxide, silver, and an indium tin oxide are sequentially stacked.

The pixel defining layer 380 may be disposed on the third organic layer 183. The pixel defining layer 380 may be configured to absorb light, for example, the pixel defining layer 380 may be black. The pixel defining layer 380 may include a black coloring agent. The black coloring agent may include a black dye and a black pigment. The black coloring agent may include carbon black, a metal such as chromium, or an oxide thereof.

An opening OP for exposing part of the anode may be defined in the pixel defining layer 380. For example, the pixel defining layer 380 may cover an edge of the anode. The pixel defining layer 380 may cover a lateral side of the third organic layer 183 provided near the light transmitting area UTA. The pixel defining layer 380 may be spaced from a lateral side of the second organic layer 182 provided near the light transmitting area UTA. Therefore, the pixel defining layer 380 may stably contact the second organic layer 182 and the third organic layer 183. The pixel defining layer 380 may be a black pixel defining layer that is made of a black organic material and may prevent or reduce light applied from the outside from being reflected to the outside again, and it may be made of a transparent organic material depending on embodiments. Hence, depending on embodiments, the pixel defining layer 380 may include a negative-type or kind black organic material, and may include a black color pigment.

A spacer 385 is positioned on the pixel defining layer 380. The spacer 385 includes a first portion 385-1 positioned in a high and narrow region and a second portion 385-2 positioned in a low and wide region. Referring to FIG. 23, the first portion 385-1 is separated from the second portion 385-2 with a dotted line in the spacer 385. The first portion 385-1 and the second portion 385-2 of the spacer 385 may be made of the same material, and they may be made of a positive-type or kind transparent photosensitive organic material, for example, a photosensitive polyimide (PSPI).

At least one portion of the upper side of the pixel defining layer 380 is covered by the spacer 385, and an edge of the second portion 385-2 is spaced from an edge of the pixel defining layer 380 so part of the pixel defining layer 380 is not covered by the spacer 385. The spacer 385 may be positioned in the region overlapping the light blocking layer 220 in a plan view, and when seen from the front surface of the display panel DP, the spacer 385 may be covered by the light blocking layer 220 and may be unseen.

The first functional layer FL1 may be disposed on the anode, the pixel defining layer 380, and the spacer 385. The first functional layer FL1 may include a hole transport layer (HTL), may include a hole injection layer (HIL), or may include the hole transport layer and the hole injection layer. The first functional layer FL1 may be disposed in the display area DA and the element area EA except the light transmitting area UTA.

The emission layer EML may be disposed on the first functional layer FL1, and may be disposed in the region that corresponds to the opening OP of the pixel defining layer 380. The emission layer EML may include an organic material, an inorganic material, or an organic-inorganic material for emitting light with set or predetermined colors.

The second functional layer FL2 may be disposed on the first functional layer FL1, and may cover the emission layer EML. The second functional layer FL2 may include an electron transport layer (ETL), may include an electron injection layer (EIL), or may include the electron transport layer and the electron injection layer. The second functional layer FL2 may be disposed in the display area DA and the element area EA except the light transmitting area UTA.

The cathode may be disposed on the second functional layer FL2. The cathode may be disposed in the display area DA and the element area EA except the light transmitting area UTA. An opening CEop that corresponds to the opening BMop of the metal layer BML may be defined in the cathode. A minimum width of the opening CEop of the cathode may be greater than a minimum width of the opening BMop of the metal layer BML.

A capping layer CPL may be further positioned on the cathode. The capping layer CPL may increase light emitting efficiency according to a constructive interference principle. For example, the capping layer CPL may include a material with a refractive index that is equal to or greater than about 1.6 for the light with a wavelength of about 589 nm. The capping layer CPL may be an organic capping layer including an organic material, an inorganic capping layer including an inorganic material, or a complex capping layer including an organic material and an inorganic material. For example, the capping layer may include a carbocyclic compound, a heterocyclic compound, an amine group-contained compound, a porphine derivative, a phthalocyanine derivative, a naphthalocyanine derivative, an alkali metal complex, an alkaline earth metal complex, or their arbitrary combinations. The carbocyclic compound, the heterocyclic compound, and the amine group-contained compound may be selectively substituted with a substituent including O, N, S, Se, Si, F, Cl, Br, I, or their arbitrary combinations.

A portion of the capping layer CPL overlapping the opening CEop of the cathode may be removed. As part of the capping layer CPL including the portion overlapping the light transmitting area UTA and part of the cathode are removed, light transmittance of the light transmitting area UTA may be increased.

An encapsulation layer 400 may be disposed on the light emitting diode. The encapsulation layer 400 may include a first inorganic encapsulation layer 401, an organic encapsulation layer 402, and a second inorganic encapsulation layer 403 that are sequentially stacked, and the layers configuring the encapsulation layer 400 are not limited thereto.

The inorganic encapsulation layers 401 and 403 may protect the light emitting diode from moisture and oxygen, and the organic encapsulation layer 402 may protect the light emitting diode from foreign particles such as dusts. The inorganic encapsulation layers 401 and 403 may include a silicon nitride layer, a silicon oxynitride layer, a silicon oxide layer, a titanium oxide layer, or an aluminum oxide layer. The organic encapsulation layer 402 may include an acryl-based organic layer, and it is not limited thereto.

A device for sensing touches may be additionally disposed on the encapsulation layer 400. To sense the touches, the device may include sensing insulating layers 501, 510, and 511 and a sensing electrode 540.

The first sensing insulating layer 501 may be disposed on the encapsulation layer 400. The first sensing insulating layer 501 may be an inorganic layer including at least one of a silicon nitride, a silicon oxynitride, or a silicon oxide. The first sensing insulating layer 501 may be an organic layer including an epoxy resin, an acryl resin, or an imide-based resin. The first sensing insulating layer 501 may have a single-layered structure, or a multi-layered structure in which layers are stacked in the third direction DR3.

At least one sensing electrode 540 may be included on the first sensing insulating layer 501, the sensing electrode 540 may have a single-layered structure, or may have a multi-layered structure in which layers are stacked in the third direction DR3.

The single-layered sensing electrode 540 may include a metal layer or a transparent conductive layer. The metal layer may include molybdenum, silver, titanium, copper, aluminum, or their alloy. The transparent conductive layer may include a transparent conductivity oxide such as an indium tin oxide, an indium zinc oxide, a zinc oxide, or an indium zinc tin oxide. In some embodiments, the transparent conductive layer may include a conductive polymer, metal nanowires, and graphene, such as PEDOT.

The multi-layered sensing electrode 540 may include metal layers. The metal layers may, for example, a triple-layered structure such as titanium/aluminum/titanium. The multi-layered conductive layer may include at least one metal layer and at least one transparent conductive layer.

When two sensing electrodes are included on the first sensing insulating layer 501, the second sensing insulating layer 510 may be disposed between two sensing electrodes. The second sensing insulating layer 510 may include an inorganic film. The inorganic film may include at least one of an aluminum oxide, a titanium oxide, a silicon oxide, a silicon nitride, a silicon oxynitride, a zirconium oxide, or a hafnium oxide.

In another way, the second sensing insulating layer 510 may include an organic layer. The organic layer may include at least one of an acryl-based resin, a methacryl-based resin, polyisoprene, a vinyl-based resin, an epoxy-based resin, a urethane-based resin, a cellulose-based resin, a siloxane-based resin, a polyimide-based resin, a polyamide-based resin, or a perylene-based resin.

The third sensing insulating layer 511 may be disposed on the sensor insulating layer 230 and may cover the second sensor conductive layer 240. The second sensor conductive layer 240 may include a conductive pattern 240P (refer to FIG. 19(A)). The third sensing insulating layer 511 may cover the conductive pattern 240P (refer to FIG. 5), and may reduce or remove the probability for the conductive pattern 240P to be damaged in a subsequent process.

The third sensing insulating layer 511 may include an inorganic material. For example, the third sensing insulating layer 511 may include a silicon nitride, and it is not specifically limited thereto.

An antireflection layer for reducing reflection of external light may be positioned on the third sensing insulating layer 511, and the antireflection layer may include a light blocking layer 220, a plurality of color filters 230, and a planarization layer 550. The light blocking layer 220 and the color filters 230 are not disposed in the light transmitting area UTA.

The light blocking layer 220 may be disposed to overlap the conductive pattern of the sensing electrode 540. The third sensing insulating layer 511 may be disposed between the light blocking layer 220 and the sensing electrode 540. The light blocking layer 220 may prevent or reduce reflection of external light caused by the sensing electrode 540. A material configuring the light blocking layer 220 includes any types (kinds) of light absorbing materials. The light blocking layer 220 is a black layer, and in an embodiment, the light blocking layer 220 may include a black coloring agent. The black coloring agent may include a black dye and a black pigment. The black coloring agent may include carbon black, a metal such as chromium, or an oxide thereof.

A plurality of openings OPBM may be defined in the light blocking layer 220. The openings OPBM may respectively overlap a plurality of emission layers EML. The color filters 230 may be disposed corresponding to the openings OPBM of the light blocking layer 220. The color filter 230 may be configured to transmit the light provided by the emission layer EML overlapping the color filter 230.

The light blocking layer 220 is not positioned in the light transmitting area UTA, and an end of the light blocking layer 220 may protrude further than the end of the pixel defining layer 380 and the end of the cathode in the region that is near the light transmitting area UTA.

The planarization layer 550 may cover the light blocking layer 220 and the color filters 230. The planarization layer 550 may include an organic material, and may provide a planar (e.g., flat) side to the upper side of the planarization layer 550. The planarization layer 550 may not be provided.

In an embodiment, the color filters 230 may not be provided, and a reflection adjusting layer may be added to the place where the color filters 230 is omitted. The reflection adjusting layer may selectively absorb the light of a set or predetermined bandwidth from among the light reflected from the inside of the display panel and/or the electronic device or the light input from the outside of the display panel and/or the electronic device.

For example, the reflection adjusting layer absorbs light of a first wavelength region of 490 nm to 505 nm and light of a second wavelength region of 585 nm to 600 nm so light transmittance of the first wavelength region and the second wavelength region may be equal to or less than 40%. The reflection adjusting layer may be configured to absorb light of the wavelength digressing from the wavelength range of the red, green, and blue light emitted by the emission layer EML. As described, the reflection adjusting layer absorbs the light with the wavelength that does not belong to the wavelength range of red, green, or blue light emitted by the emission layer EML, thereby preventing or minimizing reduction of luminance of the display panel and/or the electronic device. Further, deterioration of light emitting efficiency of the display panel and/or the electronic device may be prevented or minimized, and visibility may be improved.

The reflection adjusting layer may be made of an organic material layer including a dye, pigment, or a combination thereof. The reflection adjusting layer may include a tetraazaporphyrin (TAP)-based compound, a porphyrin-based compound, a metal porphyrin-based compound, an oxazine-based compound, a squarylium-based compound, a triarylmethane-based compound, a polymethine-based compound, a anthraquinone-based compound, a phthalocyanine-based compound, an azo-based compound, a perylene-based compound, a xanthene-based compound, a diammonium-based compound, a dipyrromethene-based compound, a cyanine-based compound, and/or one or more combinations thereof.

In an embodiment, the reflection adjusting layer may have transmittance of about 64% to about 72%. Transmittance of the reflection adjusting layer is adjustable according to a content (e.g., amount) of the pigment and/or the dye included in the reflection adjusting layer. The reflection adjusting layer may overlap the light emitting regions, and may not overlap the light transmitting area UTA in a plan view.

The metal layer BML, the first semiconductor layer ACT1, the first gate conductive layer GAT1, the second gate conductive layer GAT2, the oxide semiconductor layer ACT2, the third gate conductive layer GAT3, the first data conductive layer SD1, the second data conductive layer SD2, and the anode are not positioned in the light transmitting area UTA. The emission layer EML and the sensing electrodes 540 and 541 are not formed. According to an embodiment described with reference to FIG. 23, the buffer layer 111, the first gate insulating layer 141, the second gate insulating layer 142, the first interlayer insulating layer 161, the third gate insulating layer 143, the second interlayer insulating layer 162, the second organic layer 182, and the third organic layer 183 may not be formed.

Additionally, additional openings may be formed in the pixel defining layer 380, the light blocking layer 220, and the color filter 230 so the pixel defining layer 380, the light blocking layer 220, and the color filter 230 may not be formed in the light transmitting area UTA.

The embodiment in which three organic layers are formed, and an anode connecting opening is formed in the second organic layer and the third organic layer has been described. However, at least two organic layers may be formed, and in this instance, the anode connecting opening may be positioned on the upper organic layer positioned distant from the substrate, and a lower organic layer opening may be positioned in the lower organic layer.

Regarding the cross-sectional structure given with reference to FIG. 23, the spacer 385 and/or the pixel defining layer 380 includes no separator. A cross-sectional structure of an embodiment including a separator will now be described with reference to FIG. 24.

Figure 24:
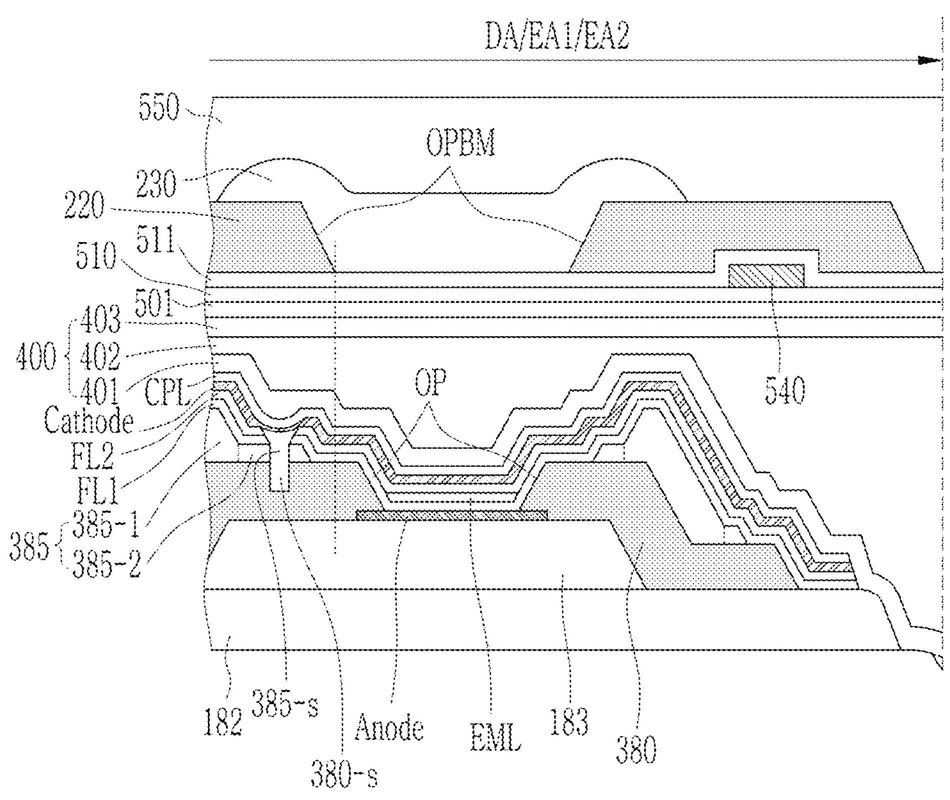
FIG. 24 shows a cross-sectional view of a light emitting display device according to another embodiment.

FIG. 24 shows a cross-sectional view of a light emitting display device according to another embodiment.

FIG. 24 omits the configuration of the substrate 110 to the first organic layer 181 shown in FIG. 23, shows the configuration including the second organic layer 182, and omits the light transmitting area UTA. Portions that differ from what are described with reference to FIG. 23 will now be described in more detail.

As shown in FIG. 13, FIG. 24 shows a light emitting display device according to the embodiment in which the separators 385-*s* and 380-*s* are formed on the spacer 385 and the pixel defining layer 380.

In detail, the separator 380-*s* is positioned on the pixel defining layer 380, and the separator 385-*s* is positioned on the second portion 385-2 of the spacer 385. The second portion 385-2 of the spacer 385 is penetrated by the separator 385-*s*, the pixel defining layer 380 is penetrated by the separator 380-*s*, and is formed to be a concave groove. However, depending on embodiments, the pixel defining layer 380 may be penetrated by the separator 380-*s*, or the separator 385-*s* may be formed on the second portion 385-2 of the spacer 385 so the separator 380-*s* may not be formed.

At least one of the functional layer FL or the cathode, positioned on the upper portions of the separators 385-*s* and 380-*s* is separated by the separators 385-*s* and 380-*s*. In an embodiment described with reference to FIG. 24, the functional layers FL-1 and FL-2 are separated by the separators 385-*s* and 380-*s*, and the cathode is not separated but its thickness is reduced. However, without being limited thereto, the cathode may be separated. Depending on embodiments, the emission layer EML positioned in the opening OP of the adjacent pixel defining layer 380 may be separated by the separators 385-*s* and 380-*s*.

At least one of the auxiliary layers, including the electron injection layer, the electron transport layer, the hole transport layer, and/or the hole injection layer included in the functional layers FL-1 and FL-2, may be separated by the separators 385-*s* and 380-*s*. When the adjacent emission layer EML and the functional layers FL-1 and FL-2 are separated by the separators 385-*s* and 380-*s*, a current flowing between the two adjacent light emitting diodes is separated to give no influences to each other.

Except the configurations of the separators 385-*s* and 380-*s*, positional relationships of the spacer 385, the pixel defining layer 380, and the light blocking layer 220 correspond to what is described with reference to FIG. 23. For example, the spacer 385 may be made of a transparent organic insulating material, differing from the pixel defining layer 380. Depending on embodiments, the spacer 385 may be made of a positive-type or kind transparent organic material. Also, as shown in FIG. 8, the gap g-1 between the pixel defining layer 380 and the second portion 385-2 of the spacer 385 may be about 5.7 μm, and it may have the value of about 3 μm to about 8 μm, depending on embodiments. The spacer U385 of the second component area EA2 in addition to the main spacer 385 may be disposed with the same material, at the same gap g-1 and on the same position in a cross-sectional view.

The light blocking layer 220 overlaps the pixel defining layer 380 and the spacer 385, the pixel defining layer 380 has a portion that does not overlap the light blocking layer 220, and the spacer 385 overlaps the light blocking layer 220 in a plan view. As shown in FIG. 8, the gap g-2 between the light blocking layer 220 and the spacer 385 represents a gap between the end of the light blocking layer 220 and the inside. The spacer U385 of the second component area EA2 as well as the main spacer 385 may have this overlapping relationship.

The separators 385-*s* and 380-*s* may be formed to separate the functional layers FL-1 and FL-2 and peripheral layers (e.g., the emission layer EML and the cathode) when the functional layers FL-1 and FL-2 are connected between the opening OP of the adjacent pixel defining layer 380.

A configuration for stacking a light emitting diode including one emission layer EML and a light emitting diode on which a plurality of emission layers EML are arranged in a tandem structure will now be described with reference to FIG. 25.

FIG. 25 shows a cross-sectional view of an emission layer according to an embodiment.

FIG. 25(A) shows a stacking configuration of the light emitting diode including one emission layer, and FIG. 25(B) shows a stacking configuration of the light emitting diode including a plurality of emission layers.

Referring to FIG. 25(A), there are an emission layer EML, and an intermediate layer including functional layers FL-1 and FL-2 positioned above and below the same between the anode and the cathode. The functional layer FL may include an electron injection layer, an electron transport layer, a hole transport layer, and a hole injection layer, the first functional layer FL-1 disposed above the anode and disposed below the emission layer EML includes the hole injection layer and the hole transport layer, and the second functional layer FL-2 positioned between the emission layer EML and the cathode may include the electron transport layer and the electron injection layer. Depending on embodiments, at least one of the functional layers FL may not be provided. FIG. 25(A) shows a stacking structure of a general light emitting diode, and the colors are determined according to the wavelengths of light emitted by the emission layer EML.

FIG. 25(B) shows a stacking configuration of the light emitting diode with a plurality of emission layers EML and having a tandem structure. The embodiment given with FIG. 25(B) includes three emission layers EML between the anode and the cathode. The respective functional layers Fla, FLb, and FLc are positioned above/below the respective emission layers EMLa, EMLb, and EMLc, and intermediate connecting layers INC1 and INC2 are positioned between the adjacent functional layers. In detail, an anode, a first functional layer Fla-1 for the first emission layer, a first emission layer EMLa, a second functional layer Fla-2 for the first emission layer, a first intermediate connecting layer INC1, a first functional layer FLb-1 for the second emission layer, a second emission layer EMLb, a second functional layer (FLb-2 for the second emission layer, a second intermediate connecting layer INC2, a first functional layer FLc-1 for the third emission layer, a third emission layer EMLc, a second functional layer (FLc-2 for the third emission layer, and a cathode are sequentially stacked on the light emitting diode having a tandem structure.

Here, the respective emission layers EMLa, EMLb, and EMLc may be configured to emit light with different wavelengths, the respective first functional layers FLa-1, FLb-1, and FLc-1 may include a hole injection layer and a hole transport layer, and the respective second functional layers FLa-2, FLb-2, and FLc-2 may include an electron transport layer and an electron injection layer. The intermediate connecting layers INC1 and INC2 may be positioned between the electron injection layer and the hole injection layer, and the intermediate connecting layers INC1 and INC2 may be referred to as charge generation layers. The intermediate connecting layers INC1 and INC2 may lower the Fermi level between two adjacent functional layers. The light emitting diode with a tandem structure may be configured to emit three colors of light to display the white color.

Depending on embodiments, the tandem structure may include two emission layers EMLa and EMLb, and in this instance, the intermediate connecting layer INC1 may be positioned between the first emission layer EMLa and the second emission layer EMLb, and the functional layer may be respectively positioned between the anode and the first emission layer EMLa, between the first emission layer EMLa and the intermediate connecting layer INC1, between the intermediate connecting layer INC1 and the second emission layer EMLb, and between the second emission layer EMLb and the cathode.

The light emitting diode with the above-noted tandem structure has a greater stacking thickness than the case of FIG. 25(A) to thus increase the possibility for the light emitting diodes of adjacent pixels to be electrically connected to each other, and particularly, when the resolution increases and density of pixels increases, the possibility for the drawbacks to be generated further increases. To separate the stacked functional layers between the adjacent light emitting diodes, the separator may be formed as shown in FIG. 13, FIG. 14, FIG. 16, FIG. 19, and FIG. 24.

Depending on embodiments, as shown in FIG. 25(A), the separator may be positioned around the light emitting diode including one emission layer EML, and the width and the depth of the separator 380-*s* may be changed according to whether there is one emission layer EML or there are multiple emission layers EML positioned in the opening OP of the pixel defining layer 380.

A circuit configuration of a pixel positioned on the lower panel layer of the light emitting display panel DP will now be described with reference to FIG. 26.

The configuration of the pixel may be a circuit configuration of the normal pixel formed in the display area DA or may be a circuit configuration of the second component pixel formed in the second component area EA2. The pixel formed in the first component area EA1 may have the same circuit configuration as FIG. 26, depending on embodiment.

Figure 26:
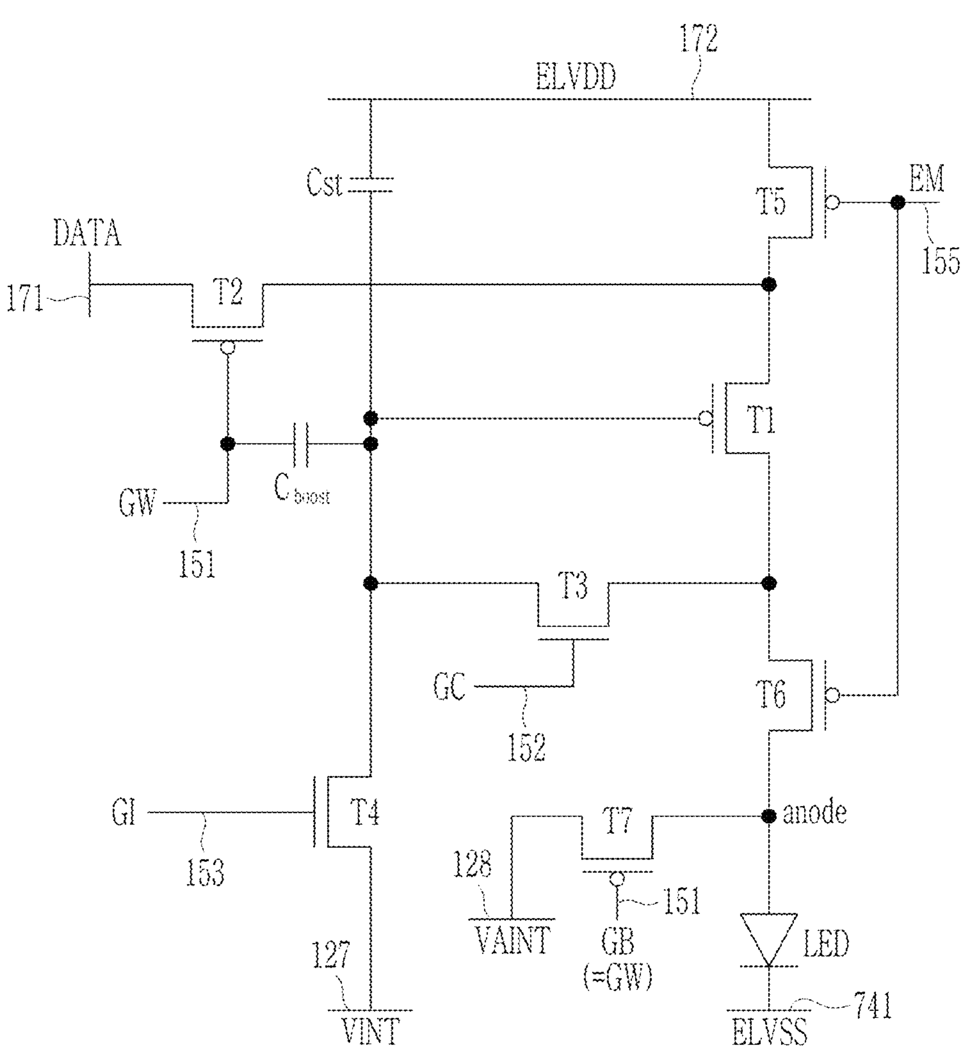
FIG. 26 shows a circuit diagram of a pixel included in a light emitting display device according to an embodiment.

FIG. 26 shows a circuit diagram of a pixel included in a light emitting display device according to an embodiment.

One pixel according to an embodiment includes transistors T1, T2, T3, T4, T5, T6, and T7, a storage capacitor Cst, a boost capacitor $C_{boost}$, and a light emitting diode LED connected to wires 127, 128, 151, 152, 153, 155, 171, 172, and 741. The transistors and the capacitor excluding the light emitting diode LED configure a pixel circuit. The boost capacitor $C_{boost}$ may not be provided depending on embodiments.

The wires 127, 128, 151, 152, 153, 155, 171, 172, and 741 are connected to one pixel PX. The wires include a first initialization voltage line 127, a second initialization voltage line 128, a first scan line 151, a second scan line 152, an initialization control line 153, a light emitting control line 155, a data line 171, a driving voltage line 172, and a common voltage line 741.

The first scan line 151 is connected to a scan driver to transmit a first scan signal GW to the second transistor T2 and the seventh transistor T7. A voltage with an opposite polarity to the voltage applied to the first scan line 151 may be applied to the second scan line 152 at a same timing as the signal of the first scan line 151. For example, when a negative-polarity voltage is applied to the first scan line 151, a positive-polarity voltage may be applied to the second scan line 152. The second scan line 152 transmits a second scan signal GC to the third transistor T3. The initialization control line 153 transmits an initialization control signal GI to the fourth transistor T4. The light emitting control line 155 transmits a light emitting control signal EM to the fifth transistor T5 and the sixth transistor T6.

The data line 171 is a wire for transmitting a data voltage DATA generated by a data driver, and according to this, the size of the light emitting current transmitted to the light emitting diode changes and the luminance of light emitted by the light emitting diode also changes. The driving voltage line 172 applies the driving voltage ELVDD. The first initialization voltage line 127 transmits a first initialization voltage VINT, and the second initialization voltage line 128 transmits a second initialize voltage VAINT. The common voltage line 741 applies a common voltage ELVSS to the cathode of the light emitting diode. The voltages applied to the driving voltage line 172, the first and second initialization voltage lines 127 and 128, and the common voltage line 741 may be constant voltages.

The driving transistor T1 (also referred to as a first transistor) is a p-type or kind transistor, and has a silicon semiconductor as a semiconductor layer.

The size of the light emitting current output to the anode of the light emitting diode is adjusted according to the size of the voltage (i.e., the voltage charged in the storage capacitor Cst) at the gate electrode of the driving transistor T1. As brightness of the light emitting diode is adjusted according to the size of the light emitting current output to the anode of the light emitting diode, the light emitting luminance of the light emitting diode LED may be adjusted according to the data voltage DATA applied to the pixel. For this purpose, the first electrode of the driving transistor T1 is disposed to receive the driving voltage ELVDD, and is connected to the driving voltage line 172 through the fifth transistor T5. The first electrode of the driving transistor T1 is connected to the second electrode of the second transistor T2 to receive the data voltage DATA. The second electrode of the driving transistor T1 outputs the light emitting current to the light emitting diode, and is connected to the anode of the light emitting diode through the sixth transistor T6 (also referred to as an output control transistor). The second electrode of the driving transistor T1 is connected to the third transistor T3 to transmit the data voltage DATA applied to the first electrode to the third transistor T3. The gate electrode of the driving transistor T1 is connected to one electrode (hereinafter, a second storage electrode) of the storage capacitor Cst. According to the voltage charged in the storage capacitor Cst, the voltage at the gate electrode of the driving transistor T1 changes and the light emitting current output by the driving transistor T1 changes. The storage capacitor Cst maintains the voltage at the gate electrode of the driving transistor T1 for one frame. The gate electrode of the driving transistor T1 is connected to the third transistor T3 to transmit the data voltage DATA applied to the first electrode of the driving transistor T1 to the gate electrode of the driving transistor T1 through the third transistor T3. The gate electrode of the driving transistor T1 may be connected to the fourth transistor T4 to receive the initialization voltage VINT and be initialized.

The second transistor T2 is a p-type or kind transistor, and has the silicon semiconductor as a semiconductor layer. The second transistor T2 allows the data voltage DATA to be received into the pixel. The gate electrode of the second transistor T2 is connected to the first scan line 151 and one electrode (referred to as a lower portion boost electrode) of the boost capacitor $C_{boost}$. The first electrode of the second transistor T2 is connected to the data line 171. The second electrode of the second transistor T2 is connected to the first electrode of the driving transistor T1. When the second transistor T2 is turned on by the negative-polarity voltage from among the first scan signal GW transmitted through the first scan line 151, the data voltage DATA transmitted through the data line 171 is transmitted to the first electrode of the driving transistor T1, and the data voltage DATA is transmitted to the gate electrode of the driving transistor T1 and is charged in the storage capacitor Cst.

The third transistor T3 is an n-type or kind transistor, and has the oxide semiconductor as the semiconductor layer. The third transistor T3 electrically connects the second electrode of the driving transistor T1 and the gate electrode of the driving transistor T1. As a result, the third transistor T3 stores the data voltage DATA in the second storage electrode of the storage capacitor Cst when the data voltage DATA is compensated by a threshold voltage of the driving transistor T1. The gate electrode of the third transistor T3 is connected to the second scan line 152, and the first electrode of the third transistor T3 is connected to the second electrode of the driving transistor T1. The second electrode of the third transistor T3 is connected to the second storage electrode of the storage capacitor Cst, the gate electrode of the driving transistor T1, and another electrode (referred to as an upper boost electrode) of the boost capacitor $C_{boost}$. The third transistor T3 is turned on by the positive-polarity voltage from among the second scan signal GC received through the second scan line 152, to connect the gate electrode of the driving transistor T1 and the second electrode of the driving transistor T1, and transmits the voltage applied to the gate electrode of the driving transistor T1 to the second storage electrode of the storage capacitor Cst to charge the same in the storage capacitor Cst. In this instance, regarding the voltage charged in the storage capacitor Cst, the voltage at the gate electrode of the driving transistor T1 when the driving transistor T1 is turned off is stored, and the threshold voltage Vth value of the driving transistor T1 is compensated and is then stored.

The fourth transistor T4 is an n-type or kind transistor, and has the oxide semiconductor as a semiconductor layer. The fourth transistor T4 initializes the gate electrode of the driving transistor T1 and the second storage electrode of the storage capacitor Cst. The gate electrode of the fourth transistor T4 is connected to the initialization control line 153, and the first electrode of the fourth transistor T4 is connected to the first initialization voltage line 127. The second electrode of the fourth transistor T4 is connected to the second electrode of the third transistor T3, the second storage electrode of the storage capacitor Cst, the gate electrode of the driving transistor T1, and the upper boost electrode of the boost capacitor $C_{boost}$. The fourth transistor T4 is turned on by the positive-polarity voltage from among the initialization control signal GI received through the initialization control line 153, and in this instance, and the first initialization voltage VINT is transmitted to the gate electrode of the driving transistor T1, the second storage electrode of the storage capacitor Cst, and the upper boost electrode of the boost capacitor $C_{boost}$ to be initialized.

The fifth transistor T5 and the sixth transistor T6 are p-type or kind transistors, and have the silicon semiconductor as the semiconductor layer.

The fifth transistor T5 transmits the driving voltage ELVDD to the driving transistor T1. The gate electrode of the fifth transistor T5 is connected to the light emitting control line 155, the first electrode of the fifth transistor T5 is connected to the driving voltage line 172, and the second electrode of the fifth transistor T5 is connected to the first electrode of the driving transistor T1.

The sixth transistor T6 transmits the light emitting current output by the driving transistor T1 to the light emitting diode. The gate electrode of the sixth transistor T6 is connected to the light emitting control line 155, the first electrode of the sixth transistor T6 is connected to the second electrode of the driving transistor T1, and the second electrode of the sixth transistor T6 is connected to the anode of the light emitting diode.

The seventh transistor T7 is a p-type or kind or n-type or kind transistor, it may have the silicon semiconductor or the oxide semiconductor as the semiconductor layer, and in an embodiment given with FIG. 26, the seventh transistor T7 is a p-type or kind transistor and includes a silicon semiconductor. The seventh transistor T7 initializes the anode of the light emitting diode. The gate electrode of the seventh transistor T7 is connected to the first scan line 151, the first electrode of the seventh transistor T7 is connected to the anode of the light emitting diode, and the second electrode of the seventh transistor T7 is connected to the second initialization voltage line 128. Here, the gate electrode of the seventh transistor T7 is connected to the first scan line 151 of a previous-stage pixel so it may not be connected to the same first scan line 151 as the gate electrode of the second transistor T2 belonging to the same pixel PX but may be connected to the same first scan line 151 as the gate electrode of the second transistor T2 of the previous-stage pixel PX. When the seventh transistor T7 is turned on by the negative-polarity voltage from among the first scan line 151, the second initialize voltage VAINT is applied to the anode of the light emitting diode and is initialized. In another way, the gate electrode of the seventh transistor T7 may be connected to an individual bypass control line for transmitting a bypass signal GB and may be controlled or selected by a wire that is different from the first scan line 151. Depending on embodiments, the second initialization voltage line 128 for applying the second initialize voltage VAINT may be identical with the first initialization voltage line 127 for applying the first initialization voltage VINT.

One pixel PX has been described to include seven transistors T1 to T7 and two capacitors (the storage capacitor Cst and the boost capacitor $C_{boost}$), and without being limited thereto, the boost capacitor $C_{boost}$ may not be provided depending on embodiments. The third transistor and the fourth transistor have been described to be formed to be the n-type or kind transistor in the embodiment, and one thereof may be formed to be the n-type or kind transistor, or another transistor (e.g., the seventh transistor, etc.,) may be formed to be the n-type or kind transistor.

While this disclosure has been described in connection with what is presently considered to be practical embodiments, it is to be understood that the present disclosure is not limited to the disclosed embodiments, but, on the contrary, is intended to cover one or more suitable modifications and equivalent arrangements included within the spirit and scope of the appended claims.

| Description of symbols | |
|---|---|
| 1000: display device | DA, DA1-1, DA1-2: display area |
| DP: display panel | EA, EA1, EA2: component area |
| ES, ES1, ES2: optical element | 380: pixel defining layer |
| OP, OPr, OPg, OPb: opening of pixel defining layer | |
| 220: light blocking layer | |
| OPBM: opening of light blocking layer | |
| 385, 385-1, 385-2, U385, U385-1, U385-2: spacer | |
| 385-s, 380-s: separator | UPC: unit pixel |
| UTA: light transmitting region | UBML: light blocking portion |
| PCX-r, PCX-g, PCX-b: pixel circuit | |
| Anode: anode | Cathode: cathode |
| EML, EMLa, EMLb, EMLc: emission layer | |
| FL, FL-1, FL-2, FLa, FLb, FLc, FLa-1, FLb-1, FLc-1, FLa-2, FLb-2, FLc-2: functional layer | |
| INC1, INC2: intermediate connecting layer | |
| 400, 401, 402, 403: encapsulation layer | |
| 50: driver | 230, 230R, 230G, 230B: color filter |
| 235: reflection adjusting layer | 501, 510, 511: sensing insulating layer |
| 540, 541: sensing electrode | 550: planarization layer |
| 110: substrate | 111: buffer layer |
| 141, 142, 143: gate insulating layer | 161, 162: interlayer insulating layer |
| 180, 181, 182, 183: organic layer | |

What is claimed is:

1. A light emitting display device comprising:

a substrate;

an anode on the substrate;

a pixel defining layer having an opening overlapping the anode;

an emission layer in the opening of the pixel defining layer;

a spacer on the pixel defining layer and having a step;

a cathode on the emission layer, the pixel defining layer, and the spacer;

an encapsulation layer on the cathode; and a light blocking layer on the encapsulation layer, wherein the spacer comprises a first portion and a second portion that is lower than the first portion and is integrally arranged with the first portion, and the first portion and the second portion of the spacer overlap the light blocking layer in a plan view.

2. The light emitting display device of claim 1, wherein the spacer is made of a transparent photosensitive polyimide (PSPI) or a positive-type photosensitive organic material, and the pixel defining layer comprises a light blocking material, and is made of a negative-type black organic material.

3. The light emitting display device of claim 1, wherein the spacer comprises a separator with a concave groove structure.

4. The light emitting display device of claim 3, wherein the concave groove structure of the separator of the spacer is arranged up to the pixel defining layer and the pixel defining layer comprises an additional separator.

5. The light emitting display device of claim 3, further comprising a functional layer above the pixel defining layer and the spacer and below the cathode, wherein the functional layer comprises a first functional layer between the anode and the emission layer and a second functional layer between the emission layer and the cathode, and at least one of the first functional layer or the second functional layer is disconnected by the separator.

6. The light emitting display device of claim 3, wherein the emission layer comprises a first emission layer and a second emission layer, an intermediate connecting layer between the first emission layer and the second emission layer, and a functional layer between the anode and the first emission layer, wherein the functional layer is between the first emission layer and the intermediate connecting layer, between the intermediate connecting layer and the second emission layer, and/or between the second emission layer and the cathode, and wherein a part of the functional layer is disconnected by the separator.

7. The light emitting display device of claim 3, wherein the separator comprises an opening corresponding portion arranged along at least a part of the opening of the pixel defining layer.

8. The light emitting display device of claim 7, wherein the separator further comprises an extension extending from the opening corresponding portion.

9. The light emitting display device of claim 1, wherein the pixel defining layer comprises a separator with a concave groove structure.

10. The light emitting display device of claim 9, wherein the spacer is inside the separator in a plan view, and the separator does not overlap the spacer in the plan view.

11. The light emitting display device of claim 1, further comprising:

a sensing insulating layer;

a sensing electrode on the encapsulation layer; and a color filter and/or a reflection adjusting layer in an opening of the light blocking layer.

12. A light emitting display device comprising a main display area; and a second component area corresponding to an optical element on a rear side, wherein the second component area comprises a unit pixel comprising a plurality of light emitting diodes, a component spacer arranged among the plurality of light emitting diodes in the unit pixel, and a light transmitting region around the unit pixel, the component spacer has a T shape, and the component spacer comprises a first portion and a second portion that is lower than the first portion and is integrally provided with the first portion.

13. The light emitting display device of claim 12, wherein the unit pixel further comprises a pixel defining layer comprising a plurality of openings, wherein the openings of the pixel defining layer correspond to the plurality of light emitting diodes included in the unit pixel, respectively, and the component spacer is on the pixel defining layer.

14. The light emitting display device of claim 13, further comprising a light blocking layer having openings overlapping the respective openings of the pixel defining layer, wherein the entire component spacer overlaps the light blocking layer in a plan view.

15. The light emitting display device of claim 14, wherein the component spacer is made of a photosensitive polyimide (PSPI) or a positive-type photosensitive organic material, and the pixel defining layer comprises a light blocking material and is made of a negative-type black organic material.

16. The light emitting display device of claim 12, wherein the unit pixel comprises three light emitting diodes, the three light emitting diodes comprising:

a first light emitting diode is left of the second and third light emitting diodes in a length direction of the unit pixel; and a second light emitting diode and a third light emitting diode, wherein the second light emitting diode is above the third light emitting diode and the second light emitting diode and the third light emitting diode are right of the first light emitting diode in the length direction.

17. The light emitting display device of claim 16, wherein the component spacer is arranged among the first to third light emitting diodes, and the component spacer has a T shape rotated by 90 degrees in a counterclockwise direction.

18. The light emitting display device of claim 17, wherein the first portion of the component spacer has a T shape rotated by 90 degrees in the counterclockwise direction.

19. The light emitting display device of claim 18, wherein the second portion of the component spacer is on respective sides of the first portion.

20. The light emitting display device of claim 19, wherein ends of the first portion and the second portion of the component spacer correspond to each other.

* * * * *